United States Patent
Jacquinot

(10) Patent No.: US 11,955,566 B2
(45) Date of Patent: Apr. 9, 2024

(54) DEVICE FOR STORING CONTROLLING AND MANIPULATING QUANTUM INFORMATION (QUBITS) ON A SEMICONDUCTOR

(71) Applicant: COMMISSARIAT À L'ENERGIE ATOMIQUE ET AUX ENERGIES ALTERNATIVES, Paris (FR)

(72) Inventor: Hélène Jacquinot, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 96 days.

(21) Appl. No.: 17/877,546

(22) Filed: Jul. 29, 2022

(65) Prior Publication Data

US 2023/0037618 A1 Feb. 9, 2023

(30) Foreign Application Priority Data

Aug. 4, 2021 (FR) ........................................ 2108459

(51) Int. Cl.
| | |
|---|---|
| *H01L 27/12* | (2006.01) |
| *H01L 29/66* | (2006.01) |
| *H01L 29/82* | (2006.01) |
| *H03K 17/92* | (2006.01) |
| *H01L 23/00* | (2006.01) |

(Continued)

(52) U.S. Cl.
CPC .............. *H01L 29/82* (2013.01); *H01L 27/12* (2013.01); *H01L 29/66977* (2013.01); *H01L 29/66984* (2013.01); *H03K 17/92* (2013.01); *H01L 24/16* (2013.01); *H01L 25/16* (2013.01); *H01L 25/18* (2013.01); *H01L 2224/16235* (2013.01)

(58) Field of Classification Search
CPC ...................................................... H01L 27/12
USPC ........................................................ 327/528
See application file for complete search history.

(56) References Cited

U.S. PATENT DOCUMENTS

| | | |
|---|---|---|
| 2017/0147939 A1 | 5/2017 | Dzurak et al. |
| 2019/0044048 A1 | 2/2019 | George et al. |

(Continued)

FOREIGN PATENT DOCUMENTS

WO    WO 2019/125500 A1    6/2019

OTHER PUBLICATIONS

Search Report as issued in French Patent Application No. 2108459, dated Apr. 14, 2022.

(Continued)

*Primary Examiner* — Tomi Skibinski
(74) *Attorney, Agent, or Firm* — Pillsbury Winthrop Shaw Pittman LLP

(57) ABSTRACT

An electronic device for storing, controlling and manipulating electron or hole spin based semiconductor qubits, the device including an electrically insulating layer and on a front face of the insulating layer, a trapping structure for electrons or holes which includes: a channel portion including at least one layer portion of semiconductor material, as well as a plurality of gates distributed for trapping at least one electron or hole in the channel portion, and on the back side of the insulating layer, an electrical track extending parallel to the insulating layer, for generating an oscillating magnetic field acting on the at least one electron or hole trapped in the trapping structure.

14 Claims, 9 Drawing Sheets

(51) Int. Cl.
*H01L 25/16* (2023.01)
*H01L 25/18* (2023.01)

(56) References Cited

U.S. PATENT DOCUMENTS

2020/0135864 A1\* 4/2020 Singh .................... H01L 29/127
2020/0410383 A1   12/2020 Morello et al.

OTHER PUBLICATIONS

Cerletti, V., et al., "Tutorial: Recipies for spin-based quantum computing," Nanotechnology, Institute of Physics Published, vol. 16, No. 4, Apr. 2005, XP020091025, pp. R27-R49.
Dehollain, J.P., et al., "Nanoscale broadband transmission lines for spin qubit control," Nanotechnology 24, (Year: 2013), pp. 1-10.
Pla, J.J., et al,. "A single-atom electron spin qubit in silicon," Nature 489, (Year: 2012), pp. 541-545.

\* cited by examiner

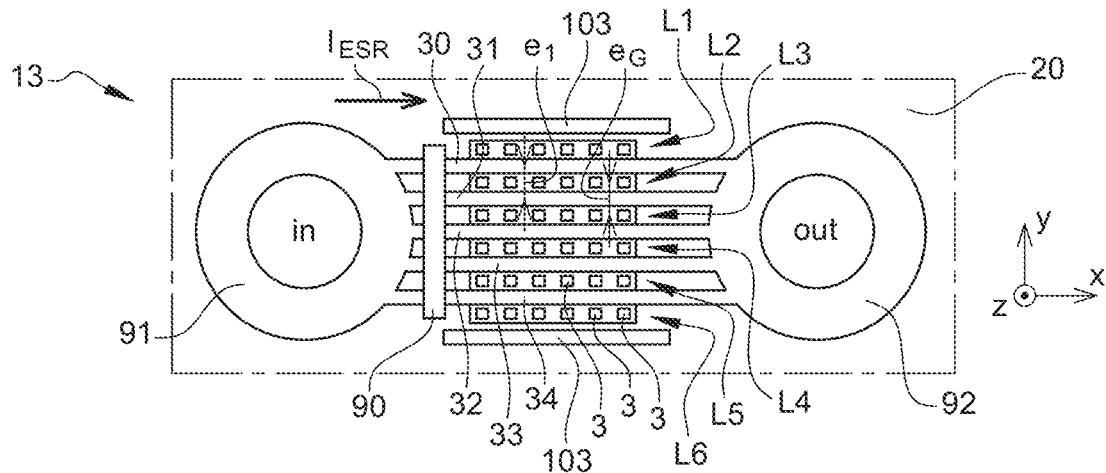
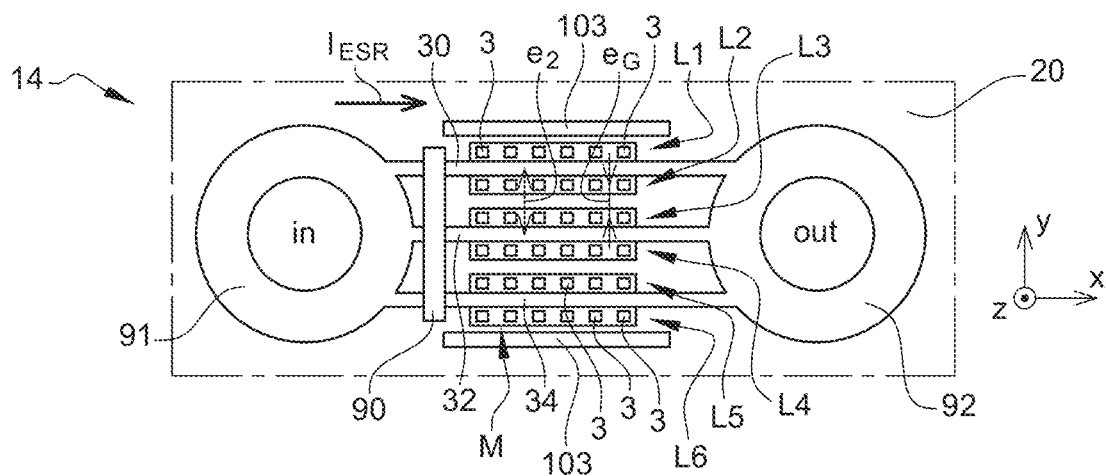
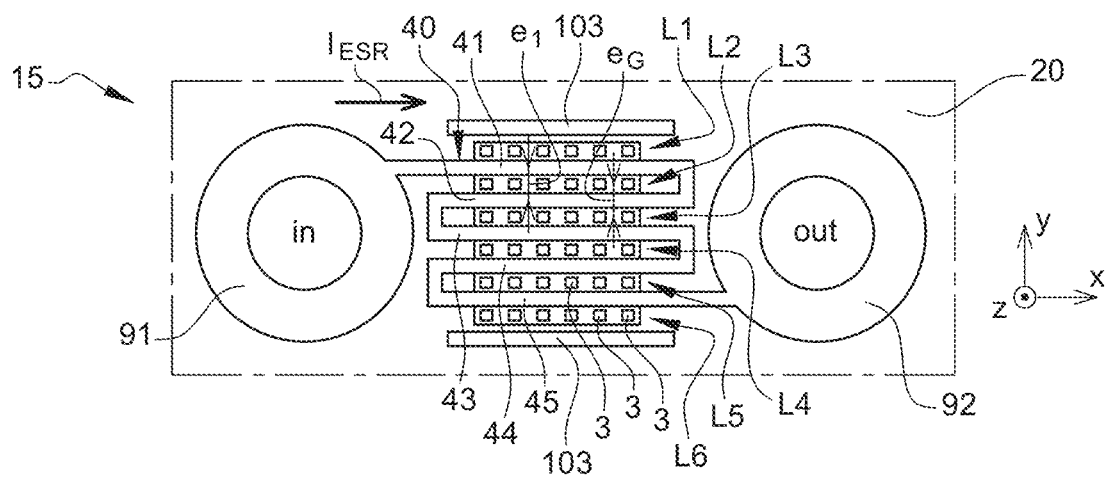

DEVICE FOR STORING CONTROLLING AND MANIPULATING QUANTUM INFORMATION (QUBITS) ON A SEMICONDUCTOR

CROSS-REFERENCE TO RELATED APPLICATIONS

This application claims priority to French Patent Application No. 2108459, filed Aug. 4, 2021, the entire content of which is incorporated herein by reference in its entirety.

TECHNICAL FIELD

The technical field is that of quantum computers, and, more generally, that of storage, control and manipulation of qubits. The present technology relates to a device for storing, controlling and manipulating quantum information (qubits) on semiconductors, the physical support for each qubit being the spin of an electron or hole stored in the device.

TECHNOLOGICAL BACKGROUND

The field of quantum information and quantum computation has been developing rapidly in recent years. Various technologies are being developed to produce quantum computers in which qubits which incidentally can be coupled to each other, are stored, controlled and manipulated, instead of storing classical 0 or 1 type binary data. Such qubits can in particular correspond to the spin of an electron or a hole, which is trapped in a quantum box, a cryogenically cooled semiconductor-based structure derived from microelectronics techniques.

FIG. 1 schematically represents a device 10' comprising such a trapping structure 1, in a cross-section and side view. This device is made from a silicon-on-insulator (SOI) substrate, initially including a thin silicon layer which covers a buried silicon oxide layer (usually called "BOX"), the whole being supported by a thicker layer of "standard" silicon (with a resistivity equal to 10 Ohm.cm, for example) or HR-Si (silicon with a high electric resistivity of 10 kOhm.cm, for example), which is marked by reference 300 in FIG. 1. The silicon oxide layer forms an insulating layer 20' on which the trapping structure 1 is made.

This structure comprises a channel portion 2, of silicon (for example isotopically pure silicon $^{28}$Si), and elements called gates in microelectronics distributed on this channel portion 2 on one level (as is the case for the gates 3 represented in FIG. 1) or on several levels (additional gates, on higher levels, not represented here). Each gate typically comprises a gate stack, with at least one insulating layer to separate the other elements of the gate from the channel portion 2. The assembly is covered with, for example, a silicon nitride layer 4 (electrically insulating). By electrically controlling all the gates of the device (including the gates 3), in particular in terms of DC electric potential, quantum boxes distributed in the channel portion (that is traps, of small size, distributed in this portion) can be created. In general, the device includes a set of gates that control the potential well of the quantum boxes and a set of gates that control tunnel barriers between quantum boxes. The quantum boxes thus created can be used to store quantum information (qubits), to read out qubits or to have charge reservoirs.

A constant magnetic field $B_0$ is generally applied to the trapping structure, and causes precession of the spin of the electron in question (in the case of FIG. 1, the magnetic field $B_0$ is oriented along a direction x parallel to the substrate). The application of this static magnetic field (for example between 100 mT and 1 T) allows the two "spin down" and "spin up" levels, associated with the spin of the trapped quasiparticles, to be well distinguished (well separated), and thus a well-controllable two-level quantum system to be obtained. To manipulate the spin of the trapped electron and modify its orientation in the Bloch sphere, an oscillating magnetic field can then be applied to this electron (magnetic field $B_{AC}$, for example, with a frequency in the gigahertz range, this oscillating magnetic field having at least one component perpendicular to the constant "orienting" magnetic field Bo. This makes it possible, especially, to switch the spin from its + state to its − state. This technique, called "ESR" (Electron Spin Resonance), is commonly used for such electron spin-based qubits on semiconductors. For electrons, this spin resonance control is usually achieved by virtue of an oscillating magnetic field, as described above. In the case of holes, as the spin-orbit interaction is important, a technique called EDSR (Electrical Dipole Spin Resonance) can also be used, in which an alternating electric field is used at the same frequencies. In the case of ESR, it is necessary to generate an electromagnetic field where only the magnetic part of the electromagnetic field will be useful. The electric part of the electromagnetic field is in turn a source of interference and it is therefore sought to minimise it.

The device 10' comprises an encapsulation layer 200, typically of silicon oxide, which protects the trapping structure. It also comprises further encapsulation layers 200, and a set of interconnecting electrical conductors 25 that electrically connect the set of gates (including gates 3) (and also the channel portion 2) to remote contact pads 26. This set is part of the structure, usually called BEOL (for "Back End Of Line"), which enables the qubits in question to be interfaced. The set of electrical interconnection conductors 25 includes especially conductive vias and electrical tracks which extend parallel to the substrate, and allow electrical connection of the gates 3 to be offset.

In order to generate the oscillating magnetic field $B_{AC}$ mentioned above, an electrical track, for example in the form of a loop, made on the upper face 204 of the "Back End Of Line" stack (this track is not represented in FIG. 1) can be used, this electrical track being traversed by an alternating electric current $I_{ESR}$ having the same frequency as the magnetic field to be generated.

But the oscillating magnetic field in question is then applied to the whole device, and especially to the interconnection network 25, thus running the risk of inducing undesirable spurious signals.

In addition, the relatively large distance between the qubits and the track serving to generate the oscillating magnetic field requires the use of a fairly strong alternating electric current, which can be a source of undesirable heating in the cryogenic environment in which the device 10' is immersed.

Another solution to create this variable magnetic field is to make the qubit(s) 3', as well as an electrical track 30' on the face 21' of an insulating layer, the track passing right next to the qubit(s), for example a few tens of nanometres away from it, as represented in FIG. 2 (figure which is FIG. 1.a. of the paper by Pla, J. et al., "A single-atom electron spin qubit in silicon", Nature 489, 541-545, 2012).

This proximity makes it possible to obtain a strong oscillating magnetic field, for a moderate current intensity $I_{ESR}$.

But this configuration rises problems of space overfilling: part of the zone located around the quantum boxes for trapping the electrons or holes is occupied by this track 30' and by the ancillary tracks for supplying the electric current $I_{ESR}$. However, the environment of these quantum boxes is already in itself overfilled, especially due to the presence of the electrical conductors used to drive the qubit(s).

SUMMARY

In this context, an electronic device is provided for storing, controlling and manipulating electron or hole spin-based semiconductor qubits, the device comprising:
  an electrically insulating layer with, on the front side, a front face, and on the back side, a back face,
  on the front face of the insulating layer, a trapping structure for electrons or holes which includes:
    a channel portion, at least partly formed by a layer portion of semiconductor material extending in a plane parallel to said insulating layer, and
    a plurality of mutually distinct gates, distributed in one or more levels over the channel portion on a side of the channel portion opposite to said insulating layer (for trapping at least one electron or hole in the channel portion), the gates of the trapping structure being distributed along lines parallel to each other,
  on the back side of the insulating layer, an electrical track extending in a plane parallel to the insulating layer, for generating an oscillating magnetic field acting on the at least one electron or hole trapped in the trapping structure, the track including a plurality of portions, each parallel to said lines, and which are electrically connected in series one after the other to form meanders.

As explained below, this track configuration (with these portions connected in series to form meanders) is favourable to obtain a magnetic field having a component perpendicular to the layers, at the trapped electrons or holes; it also makes it possible to locate this magnetic field in the vicinity of the tracks (with a rapid decrease in the amplitude of the magnetic field as a function of the distance).

The present technology also relates to a device, as described above,
  but including a plurality of electrical tracks, including said track, said tracks being located in the same plane and each being parallel to said gate rows, said tracks being electrically connected in parallel with each other,
  instead of comprising said track portions electrically connected in series one after the other to form meanders.

The latter configuration, with an electrical supply in parallel (and therefore an electric current in the same direction) for these different tracks, is in turn favourable to obtaining a magnetic field having a component parallel to the layers, at the trapped electrons or holes.

Moreover, as the electric track is located on a side of the insulating layer opposite to the trapping structure, the electric track can also play the role of a "back-gate", in addition to creating the magnetic field in question, thus providing an additional means for controlling the electric potential landscape within the channel portion where said at least one electron or hole is trapped.

The electrical track, for generating the oscillating magnetic field for ESR resonance (hereinafter referred to as the «ESR» track), is thus made on the back side (on the "back-side", from a technological point of view), while the trapping structure is made on the front face (on the "front-side"). The vias and conductor lines for the electrical interconnection of the gates of the trapping structure are also generally made on the front side of the insulating layer in question (see FIG. 5 for example).

As mentioned just above, this electrical track, because of the possibility of adjusting polarisation of the trapping structure (or possibly trapping structures), being back (on the opposite side of the trapping structure to the insulating layer) allows additional control of the electric potential landscape within the channel portion (especially to control the quantum boxes mentioned above). More specifically, such a back-gate allows for independent control of the depth of the potential well as well as the electric field within the quantum box, which is a definite advantage (in the absence of a "back-gate" the electric field within the quantum box cannot be controlled independently of its depth, this electric field being then directly related to the depth of the well, being all the stronger the deeper the well).

The device is typically made from a semiconductor-on-insulator substrate, for example a Silicon-on-insulator "SOI" or Germanium-on-insulator "GeOI" substrate. Such a substrate initially comprises a thin layer of semiconductor (for example a thin layer of silicon) covering a buried oxide layer of this semiconductor (the "box"), the whole being supported by a layer of said semiconductor, which is thicker and generally has a high electric resistivity (no or little intentional doping for this support layer). It is then this buried semiconductor oxide layer (possibly thinned upon manufacturing), which, after manufacture, forms the insulating layer mentioned above, on which the trapping structure is located, and under which the "ESR" electrical track extends.

In comparison with a front side only device, the addition of structures to the back side of the insulating layer (the addition of the "ESR" electrical track, and the electrical conductors for interconnecting this track) complicates the manufacturing. This two-sided manufacture may especially require returning the substrate upside down upon manufacturing and adding structures serving as handles or structural reinforcements.

However, on the other hand, making the «ESR» track on the back side provides many benefits:
  on the front face, it releases the zone located in the immediate vicinity of the trapping structure, and thus eliminates the above-mentioned space overfilling problems of this zone (with reference to FIG. 2); this simplification is particularly interesting when the trapping structure forms a two-dimensional trap matrix, leaving little access to the qubits from a lateral point of view;
  the oscillating electromagnetic field, exerted on the front part of the device other than the trapping structure, in particular that exerted on the interconnection structure of the gates (vias and conductive lines), is limited (and spurious signals that may be induced by this field are therefore advantageously limited as well), since the source of this electromagnetic field, which is the ESR track in question, is distant from the front part of the device (this track being located in the back part); from this point of view, the configuration claimed is clearly more interesting than the configuration of prior art mentioned above with reference to FIG. 1, in which the «ESR» track is made on one face (upper face 204) of the "back end of line" (see FIG. 1); this advantage can also be enhanced by giving the «ESR» track a serpentine shape (with meanders), with successive portions traversed in opposite directions by the electric current so as to create a strong magnetic field in the vicinity of the track, but very rapidly decreasing when moving away from the track (see FIGS. 9 and 23 for example);

Further, this configuration allows the application of a controlled static electric potential (DC) or any electric signal (LF, RF, pulse . . . ) to the back side of the qubits (opposite to the gates, with respect to the channel portion mentioned above), which provides an additional degree of freedom to control the energy landscape (with potential well) in which the electrons or holes are trapped, without having to add any additional structure for controlling this potential;

making the ESR track on the back side of the insulating layer allows a very important configuration flexibility for this track, so that the geometry of the track can be chosen with a lot of freedom (in a "serpentine" way or not; laterally shifted with respect to the qubits or not; with a lateral periodicity equal to the one of the 2D qubit matrix, or equal to the double of it, etc. The ability to freely choose this geometry is interesting because it directly influences properties of the magnetic field created (mainly perpendicular to the layer, or on the contrary parallel to it; having a strong decrease as a function of distance, or not, etc.);

making the «ESR» track on the back side of the insulating layer further allows use of different types of microelectronic technologies (in particular different types of materials) for the part on the front side (trapping structure) and for the part on the back side (ESR track). For example, superconducting materials can be used for the ESR track, which have the advantage of dramatically reducing the electric part of the electromagnetic field generated by the ESR track and thus the electric field induced interference.

The channel portion of the trapping structure is located on the insulating layer in question, either directly on the insulating layer (in other words, against the insulating layer, in contact with it), or by being separated from the insulating layer by one or more ancillary layers, having generally a small thickness (for example, less than 0.2 micron or even less than 50 nm). Similarly, the «ESR» track may be made directly under the insulating layer in question, against it, or be separated from the insulating layer by one or more other layers, such as a metallisation layer for example.

It will be noted that when the insulating layer in question initially constitutes, prior to manufacture, all or part of the buried oxide layer of a semiconductor-on-insulator substrate, it has particular properties in comparison with any oxide layer. In terms of interface quality (low density of traps or defects at the interface) and regularity for example, this thermal oxide layer has better properties than any other semiconductor oxide layer such as an encapsulation layer made by plasma oxidation or low temperature deposition (typically below 500 or 600 degrees Celsius) for example. The specificity of this layer is also its small thickness, typically less than 150 nm, for example 15 nm, which also gives it great regularity. This regularity manifests itself especially on the surface, where it allows better match with a layer of the semiconductor in question (for example silicon) that would be epitaxially grown on the insulating layer, for example to make the channel portion, or, simply with the initial upper layer of the semiconductor-on-insulator type substrate, etched to form the channel portion in question.

More generally, the insulating layer may be formed by an oxide of the semiconductor in question (for example $SiO_2$) annealed at very high temperature (above 700 and even 1000 degrees Celsius) related to "smart-cut" technology. In comparison with a cold-annealed oxide layer, such as the dielectric layer between the FEOL (front-end-of-line), mower part where the channel and gates are made, and the BEOL (upper part of the gate interconnection structure), such a thermal oxide layer has better properties in terms of residual surface roughness, propensity to crack opening or propagation, and more generally interface quality.

Further to the characteristics set forth above, the device set forth above may have one or more of the following optional characteristics, considered individually or according to any technically contemplatable combination:

the insulating layer has a thickness between 5 nm and 200 nm, or even between 10 nm (10 nanometres) and 150 nm;

said track and said gates are separated by a distance of less than or equal to 200 nanometres, in a direction perpendicular to the insulating layer;

said track and said gates are separated by a distance less than or equal to 100 nm, along a direction perpendicular to the insulating layer; it will be noted that such a distance is much less than the usual thickness of an encapsulation layer (generally greater than 200 nm or more), and that, in general, in an integrated microelectronic device, the distance between the first metallisation plane and the active zones located under the gates is usually greater than at least 200 nm;

in a projection onto a plane parallel to the insulating layer, each gate is separated from said track by a lateral gap which is less than or equal to said distance;

in a projection onto a plane parallel to the insulating layer, each gate is separated from said track by a lateral gap that is less than or equal to 200 nm, or even less than or equal to 100 nm;

said track is separated from said back face by an intermediate layer; or, on the contrary, said track is located directly against said back face;

the insulating layer is at least partly formed by a semiconductor oxide which has been annealed at a temperature above 700 degrees Celsius;

the insulating layer is a semiconductor oxide layer making up at least part of the buried oxide layer of a semiconductor-on-insulator substrate, such as a Silicon-on-Insulator "SOI" or Germanium-on-insulator "GeOI" substrate; the thick support layer of the substrate, which initially supports the buried oxide layer, may be entirely removed upon manufacturing and no longer present in the device, once manufactured. The buried oxide layer may further be thinned, either over its entire surface or more locally at the ESR track. Alternatively the support layer of the substrate could be partly kept by being etched at the ESR track (to provide access to the back face of the buried oxide layer), but not the entire surface of the substrate;

the device further comprises a first set of interconnecting electrical conductors, which electrically connect the gates to first pads or contact elements remote from the trapping structure, this first set of conductors extending from the front side of the insulating layer;

the device further comprises a second set of electrical interconnection conductors, which electrically connect said track to second pads or contact elements remote from said track, this second set of conductors extending from the back side of the insulating layer;

the device does not comprise an electrical connector which is electrically connected to the gates and which is located on the back side of the insulating layer;

the device does not comprise an electrical connector which is electrically connected to said track and which is located on the front side of the insulating layer;

in a projection onto a plane parallel to the insulating layer, the track at least partly overlaps with each of the gates or even overlaps with the whole of each gate; stated differently, there is at least partial vertical overlap between the track and each of the gates; stated still differently, for each gate, at least part of the track is located vertically aligned with part of the gate;

said tracks, or track portions, are periodically laterally spaced from each other with a spacing which is the same as the spacing that laterally separates two adjacent gate rows;

said tracks, or track portions, are periodically laterally spaced from each other at a spacing which is twice the spacing which laterally separates two adjacent gate rows;

in a projection onto a plane parallel to the insulating layer, each track, or each of said track portions, is interposed between two adjacent gate rows; and in a projection onto a plane parallel to the insulating layer, said track forms a plurality of loop portions, each loop portion being located at one of said gates or at a gate island gathering some of said gates;

in a projection onto a plane parallel to the insulating layer, each loop portion partially surrounds the corresponding gate or island of gates.

The present technology also relates to a method for driving an electronic device as set forth above, wherein an alternating electric current is injected into said electric track to exert an oscillating magnetic field on said at least one electron or hole trapped in said trapping structure, and wherein the electric track is further employed as a back gate, an electric potential being applied to said electric track to control an electric potential landscape within the channel portion where said at least one electron or hole is trapped. The electric potential in question is for example a static, or low frequency (frequency below 10 kHz), or radio frequency (frequency between 10 kHz and 100 GHz), or pulsed electric potential, or being a combination of such electric potentials. It may be yet another type of electrical signal.

The present technology also relates to a method for manufacturing an electronic device for storing, controlling and manipulating electron or hole spin based semiconductor qubits, the device comprising an electrically insulating layer with, on the front side, a front face, and on the back side, a back face, the method comprising the following steps of:

on the front side of the insulating layer, making an electron or hole trapping structure which includes:
  a channel portion, at least partly formed by a layer portion of semiconductor material extending in a plane parallel to said insulating layer, and
  a plurality of mutually distinct gates, distributed in one or more levels over the channel portion, on a side of the channel portion opposite to said insulating layer, the gates of the trapping structure being distributed along lines parallel to each other, and on the back side of the insulating layer, providing an electrical track which extends in a plane parallel to the insulating layer, for generating an oscillating magnetic field acting on the at least one electron or hole trapped in the trapping structure, the track including a plurality of portions, each parallel to said lines, and which are electrically connected in series one after the other to form meanders.

The present technology also relates to a manufacturing method, as described above, but in which several tracks, including said track, are manufactured, instead of said meander-forming row portions, which tracks lie in a same plane and are each parallel to said gate rows, said tracks being electrically connected in parallel with each other.

The optional manufacturing characteristics set forth above may also apply to this manufacturing method.

The present technology and its different applications will be better understood upon reading the following description and upon examining the accompanying figures.

BRIEF DESCRIPTION OF THE FIGURES

The figures are set forth by way of indicating and in no way limiting purposes.

FIG. 7 schematically represents a forth embodiment of such a device, in a bottom view.

FIG. 8 schematically represents a fifth embodiment of such a device, in a bottom view.

FIG. 9 schematically represents a sixth embodiment of such a device, in a bottom view.

DETAILED DESCRIPTION

Figure 1:
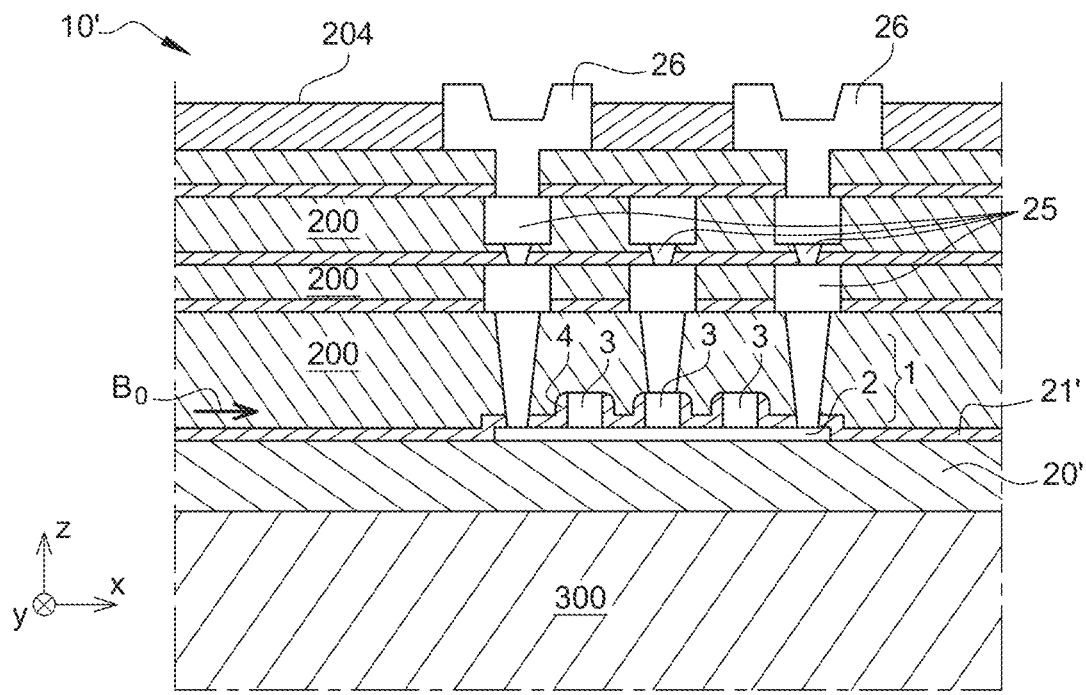
FIG. 1 schematically represents a device for storing, controlling and manipulating semiconductor qubits of the state of the art, in a side, cross-section view.
Figure 2:
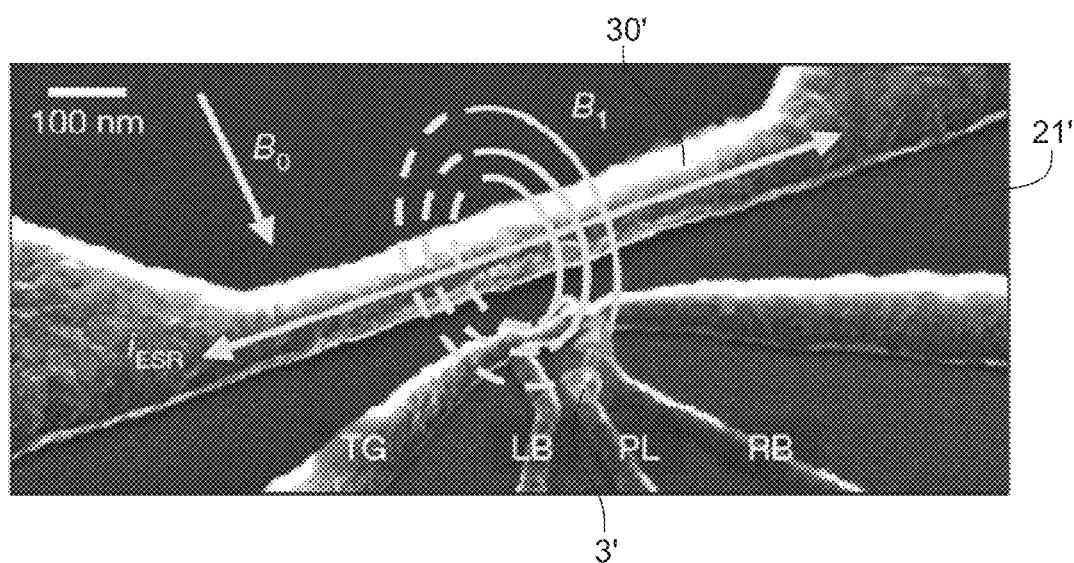
FIG. 2 is a scanning electron microscopy view of another device for storing, controlling and manipulating semiconductor qubits of the state of the art.

The present technology relates to an electronic device for storing, controlling and manipulating electron or hole spin based semiconductor qubits. This device comprises (see FIGS. 4 and 5 for example):
- a trapping structure 1 for trapping electron(s) (or hole(s)), the spin(s) of which can be employed as qubits, and
- an electric track (track 30, in FIGS. 4 and 5), which, when traversed by an alternating electric current $I_{ESR}$, generates an oscillating magnetic field $B_{AC}$ which is exerted on the electron(s) trapped in the trapping structure 1, thereby manipulating their spin(s) by ESR-type resonance; this electric track is indifferently referred to as an ESR track, or simply as a track or an electric track, in the following.

Remarkably, the trapping structure 1 is made on a front face 21 of an insulating layer 20, on the front side 23 of this layer, while the ESR track is located on the back side 24 of the insulating layer.

The ESR track is thus made on the back face (on the "back-side", from a technological point of view), whereas the trapping structure 1, as well as its connector system 25, are made on the front face (on the "front-side"). Initially, before the device is manufactured, the insulating layer 20 in question forms the "box", that is for example the buried silicon oxide layer of a silicon-on-insulator (SOI) type substrate.

As explained in the part entitled "summary", this configuration, with the ESR track made on the back face, allows:
- to limit space overfilling in the immediate environment of the qubits,
- reduction in the oscillating magnetic field in the upper part of the device, in particular in the connector system 25 (decrease in the induced spurious signals),
- application of a controlled electric potential to the back face of the trapping structure, to control the energy landscape in which electrons or holes are trapped,
- a large degree of freedom relating to the geometrical configuration of the ESR track.

The ESR track in question may moreover include several contiguous portions. And, at the back face, the device may include several ESR tracks, including the one mentioned above, through which an alternating electric current flows and which together contribute to the generation of the oscillating magnetic field $B_{AC}$.

Figure 24:
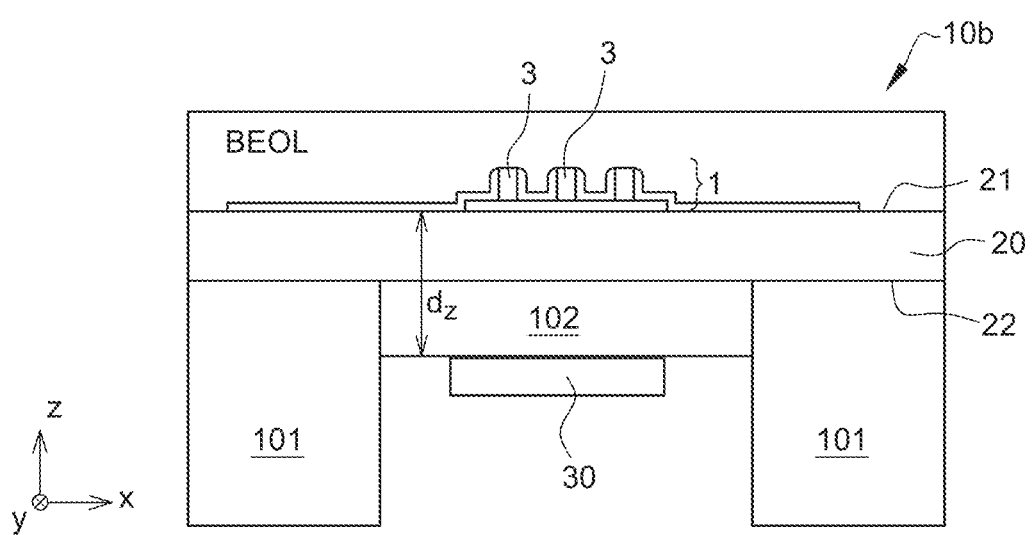
FIG. 24 schematically represents one alternative of the device of FIG. 4, in a cross-section and side view.

Several embodiments of the device, which bear the references 10, 11, 12, 13, 14, 15, 16, 17, 18 and 19 respectively, are represented in FIGS. 3, 5, 6, 7, 8, 9, 10, 11, 12 and 13 respectively. FIG. 24 additionally shows one alternative, 10b, to the device 10 of FIG. 4.

The embodiments 13 to 19 differ from each other primarily in the number, shape or arrangement of the ESR track(s) in the plane (plane parallel to the insulating layer 20) in which the ESR track(s) extend(s).

These different embodiments nevertheless have many common features. Therefore, from one embodiment to another, identical or corresponding elements will generally be marked with the same reference signs.

Initially, the overall structure of the device 10; 10b; 11; 12; 13; 14; 15; 16; 17; 18; 19, and different elements that may be included in the front part 24 and the back part 23 of the device respectively (trapping structure, interconnection or assembly elements, ESR track) will be described in a general manner. Different shapes and arrangements contemplatable for the ESR track(s) themselves will be set forth next, with reference to FIGS. 7 to 21.

Overall Structure

Figure 4:
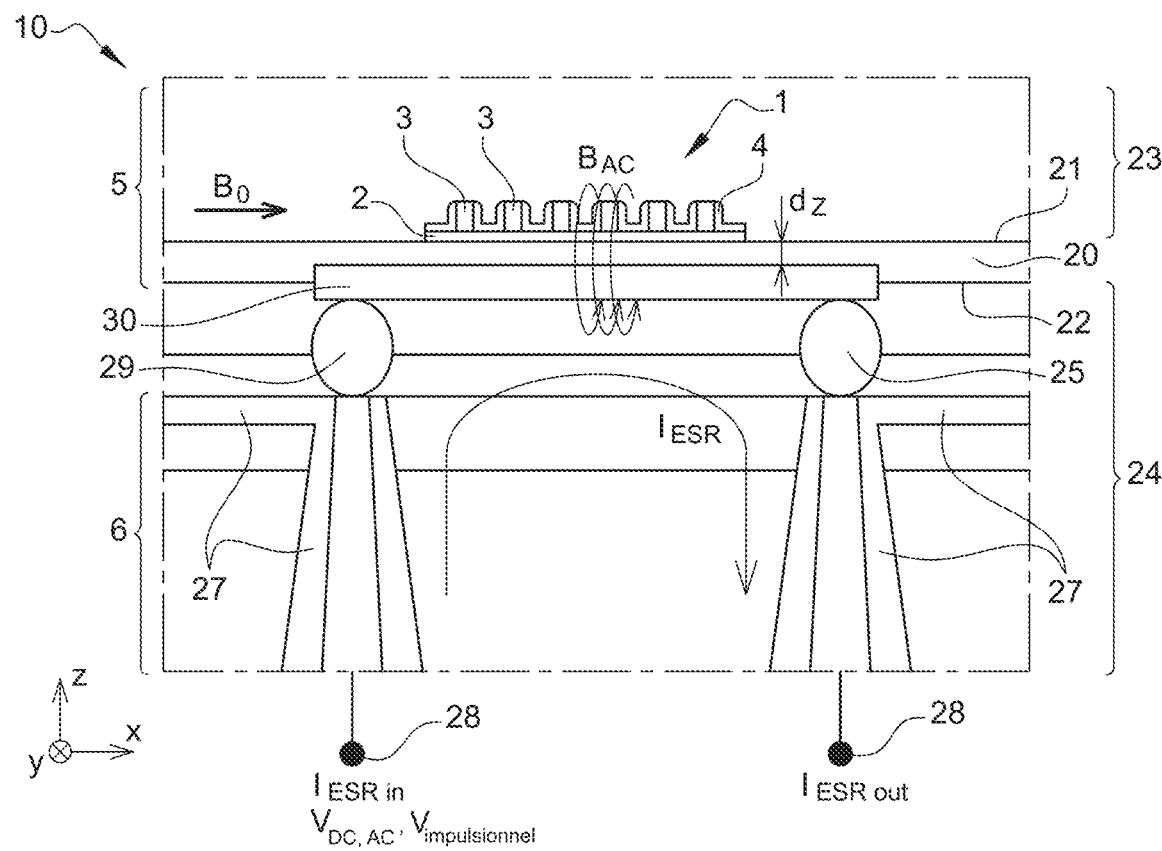
FIG. 4 schematically represents the device of FIG. 3, in a cross-section and side view.
Figure 5:
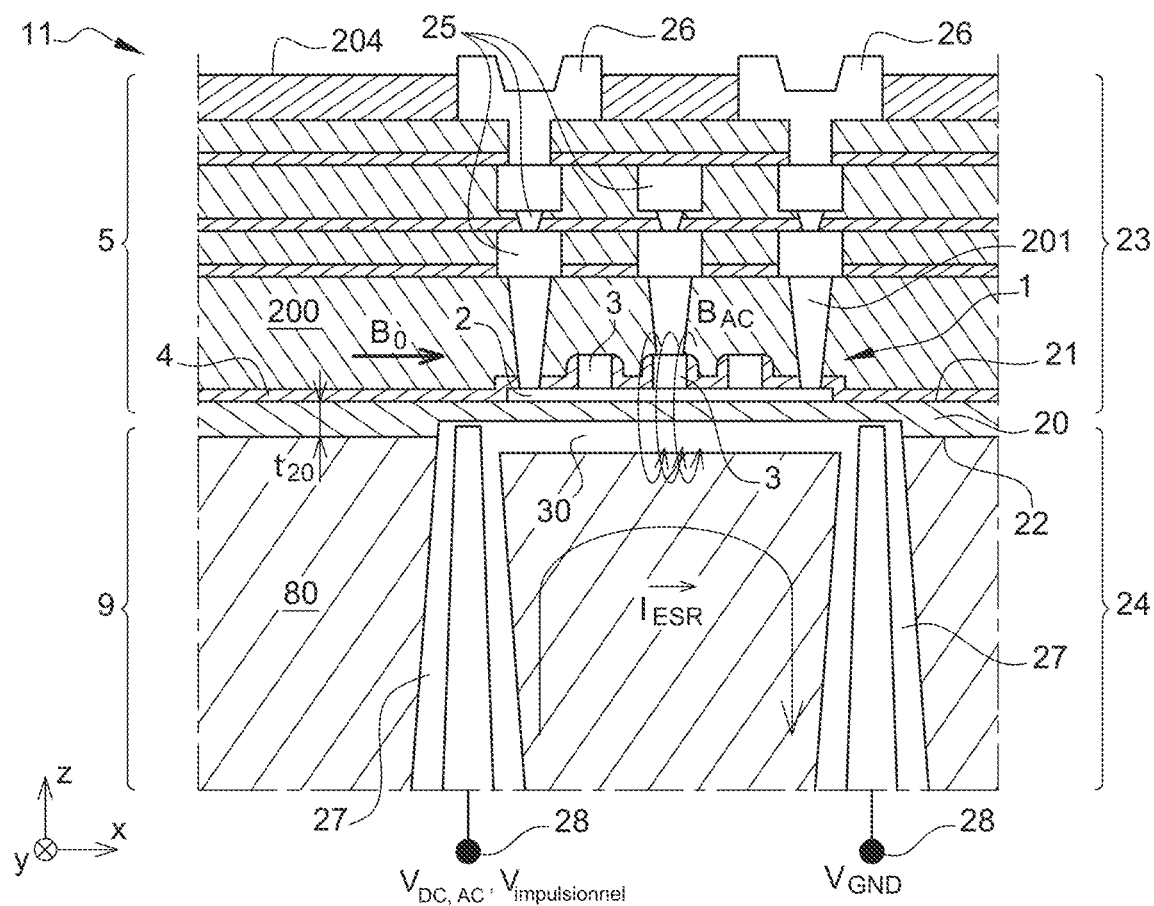
FIG. 5 schematically represents a second embodiment of such a device, in a cross-section and side view.
Figure 6:
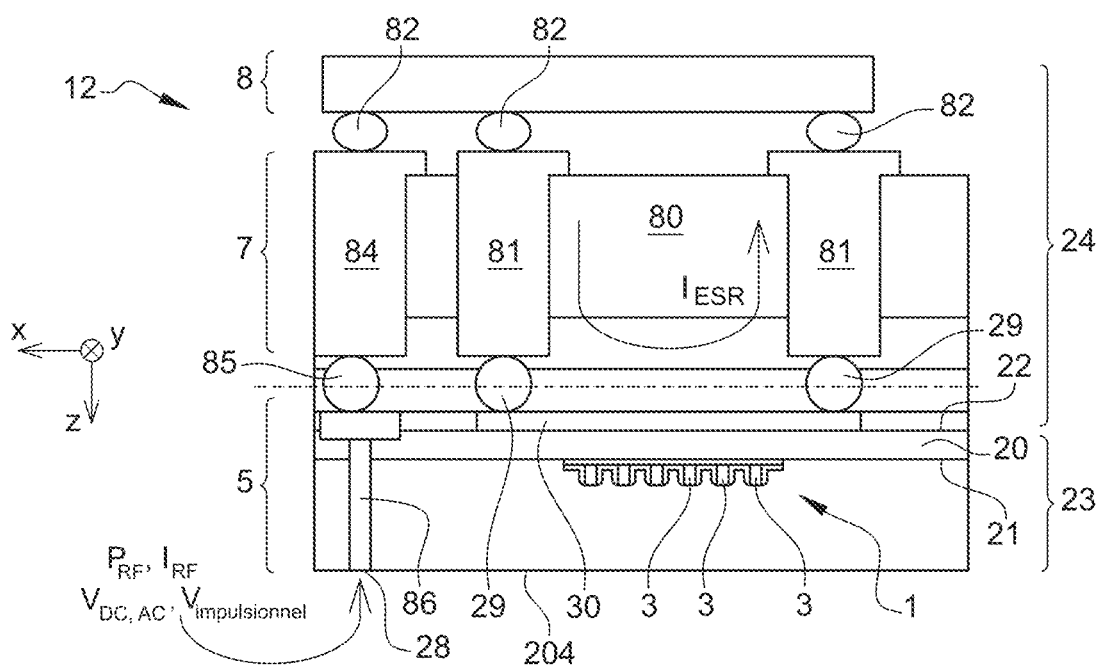
FIG. 6 schematically represents a third embodiment of such a device, in a cross-section and side view.

The insulating layer 20 is delimited, on the front side, by a front face 21 and, on the back side, by a back face 22, both parallel to the insulating layer 20 (see FIGS. 4 to 6). This layer separates the front side of the device, 23, from its back side 24. The insulating layer 20 has here a small thickness $t_{20}$, less than 200 nm or even 100 or 10 nm. As indicated above, this insulating layer, prior to the manufacture of the device, formed all or part of a buried oxide layer of a silicon-on-insulator (SOI) type substrate. This is a silicon oxide layer that has been annealed at a temperature of at least 700 or even 1000 degrees Celsius.

Whatever the embodiment considered, the trapping structure 1 comprises:
- a channel portion 2 comprising at least one layer portion of semiconductor material parallel to the insulating layer 20, and
- a plurality of gates 3 distinct from each other, distributed in one or more levels on the channel portion 2, on a side of the channel portion opposite to the insulating layer 20 (thus on the front side of the channel portion).

By electrically controlling the gates 3, in particular in terms of electric potential DC, a potential well or wells can be created in the channel portion 2, and one or more electrons or holes can be trapped therein, the spin of which can serve as a qubit. Electrical contacts are further provided on the channel portion 2 (see for example the conductive via 201, in FIG. 5), to perform drain and source functions. It will be noted that several gates can be used together to create one of these potential wells (one of the quantum boxes). Stated differently, there can be several gates (for example two) associated with a single trap. Moreover, not all the trapped electrons or holes necessarily serve to store a qubit. And it could be contemplated to use several trapped electrons together to store a single quantum variable (in collective form, in this spin set). Furthermore, as represented in FIGS. 4 to 6, the gates 3 are distributed on the same level, on the channel portion 2 (that is in the same plane, parallel to the channel portion, or, stated differently, at the same height with respect to the channel portion). Alternatively, however, the device could comprise additional gates, distributed on a different level with respect to the channel portion (for example further away from it). In any case, the fact that the gates are distributed over the channel portion does not necessarily mean that they are located directly against this channel portion (one or more intermediate layers may be present). In general, all the gates (especially the gates 3 represented in the figures) are electrically connected to remote contact pads or elements (via the BEOL), as explained below.

The channel portion 2 extends over the front face 21 of the insulating layer 20, for example directly over this side, in contact therewith. Alternatively, however, one or more ancillary layers could be interposed between the channel portion 2 and the front face 21. The channel portion 2 is, for example, entirely formed of silicon (for example isotopically pure silicon $^{28}$Si) or of an alloy of silicon and germanium, or of a stack of sub-layers, some of which are made of silicon and others of an alloy of silicon and germanium. The channel portion is typically between 5 and 200 nm, or even between 10 and 30 nm thick. It is a channel portion in that electrons or holes could move within this element, disregarding the traps created by polarising the gates. And it is a channel portion because this element is laterally delimited, and occupies only a small part of face 21.

Each gate 3 typically comprises a gate stack, with at least one insulating layer (for example of thermal silicon oxide, that is having been annealed at at least 700 or even 1000 degrees) separating the channel portion 2 from a stack of metals (for example TiN, Ta or Al) and/or polycrystalline silicon of the gate.

On the channel portion 2, the gates 3 may be distributed along the same line, one after the other. They may also be distributed along different rows L1, L2, L3, ..., L6 parallel to each other (see FIGS. 3 and 7 for example), with, along each of these lines, gates distributed one after the other (case of the embodiments represented in the figures).

Each of these rows L1, L2, L3, ..., L6 is then parallel to a same axis, noted x, an axis which is parallel to the insulating layer 20. The y-axis represented in the figures is an axis parallel to the insulating layer 20 and perpendicular to the x-axis. As regards z-axis, it is perpendicular to the insulating layer 20. This system of three axes x,y,z is used identically throughout FIGS. 3 to 23.

Figure 15:
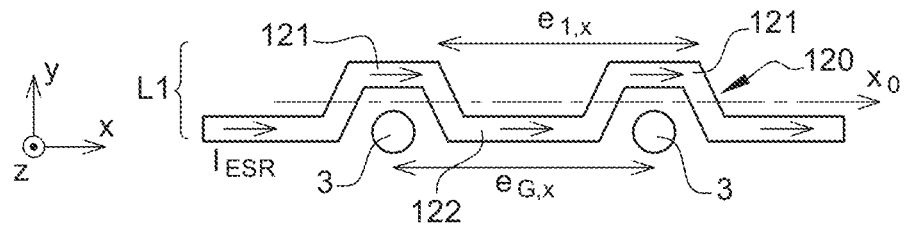
FIG. 15 schematically represents another alternative for such an ESR track.
Figure 16:
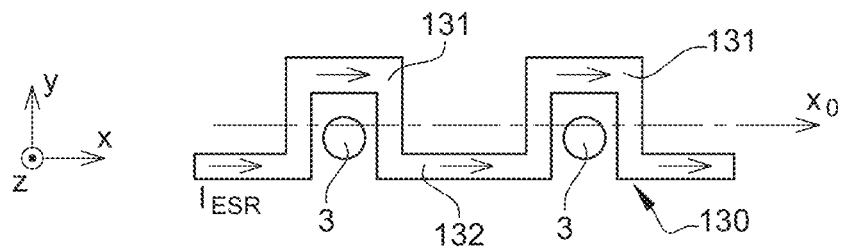
FIG. 16 schematically represents yet another alternative of such an ESR track.
Figure 17:
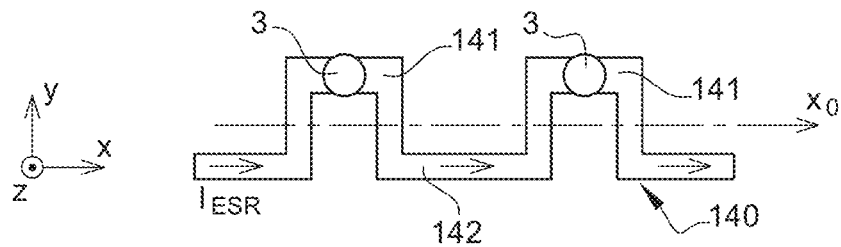
FIG. 17 schematically represents yet another alternative of such an ESR track.
Figure 18:
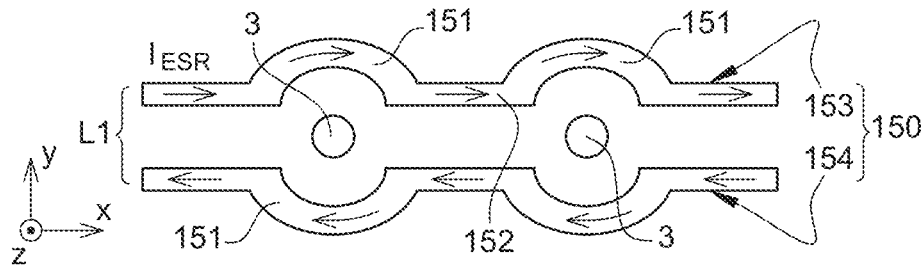
FIG. 18 schematically represents yet another alternative of such an ESR track.
Figure 20:
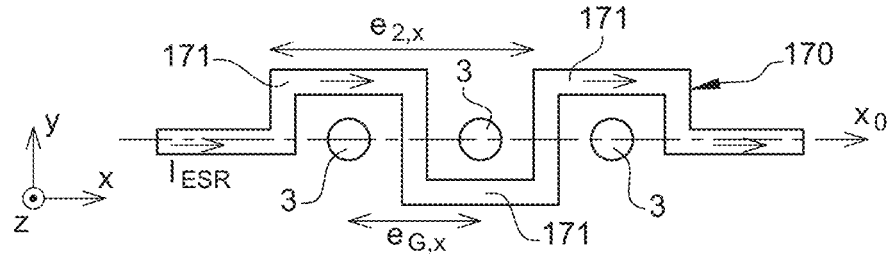
FIG. 20 schematically represents yet another alternative of such an ESR track.

Here, the gates 3 are more precisely distributed in a matrix, that is both in rows and columns. In other words, they are periodically distributed in a rectangular network. In parallel to the x-axis, the gates 3 are repeated with a pitch $e_{G,X}$ (FIGS. 15 and 20). In parallel to the y-axis, they are repeated with a pitch $e_G$ (FIGS. 7 to 10), which is the lateral gap between two adjacent rows L1-L6 of gates 3. The pitch $e_{G,X}$ and the pitch $e_G$ (photorepetition pitch) are for example each between 50 nm and 1 micron, or even between 50 and 200 nm.

In other exemplary embodiments (not represented), the gates could be gathered into islands, for example into islands of two or four gates, the islands themselves then being able to be distributed in a row one after the other, or in a matrix, over the channel portion 2. Each island of gates may serve to store, control and manipulate either a single qubit (corresponding to the case where several gates are employed to control each trap), or possibly several qubits.

The set comprising the channel portion 2 and the gates 3 is covered with a layer of dielectric material 4, preferably a dielectric material that can serve as a barrier layer when etching the electrical contacts of the gates or the drain/source. This material is, for example, silicon nitride. An insulating encapsulation layer 200, typically of silicon oxide, covers the trap structure 1 and the rest of the insulating layer 20. This layer has conductive vias therethrough, such as the via 201 mentioned above.

The device 10; 10b, 11; 12; 13; 14; 15; 16; 17; 18; 19 also comprises a first set of electrical interconnection conductors, 25, which electrically connect the gates 3, as well as the source(s) and drains, to first pads 26 or remote contact elements of the trapping structure 1. This first set of conductors 25 extends from the front face 23, but not from the back side of the insulating layer 20 (see FIG. 5; in FIGS. 4 and 6, this set of conductors has not been represented in order to keep the figure light). The pads 26 or contact elements are located on the front side of the device, for example on a front face 204 of the device.

This first set of conductors 25 is located in a front part of the device, usually called BEOL (for "Back End Of Line"), in which a three-dimensional electrical interconnection structure is made, which typically comprises insulating layers (for example other encapsulation layers 200) through which planes that are conductive vias can pass, as well as metallisation planes parallel to the layers, etched to obtain conductive interconnection tracks, some of which are part of the first set of conductors 25 mentioned above (set 25 used to offset the electrical connection of the gates 3). The whole structure is generally thicker than 1 micron, or even thicker than 10 microns.

A constant magnetic field $B_0$ is applied to the trapping structure 1, to process the spin of each electron trapped stored in the trapping structure 1. In the example of FIG. 5, this field is parallel to the x-axis. However, it could be oriented differently.

The electrical ESR track, which bears reference 30 in FIGS. 3 to 6, generates the aforementioned oscillating magnetic field $B_{AC}$ when the alternating current $I_{ESR}$ flows therethrough. As already indicated, this track is located on the back side 24 of the insulating layer 20. It extends in parallel to the insulating layer 20. It has, for example, a width of between 30 nm and 2 microns, and even more between 30 nm and 200 nm. It is made of a material having a high electrical conductivity at cryogenic temperature, such as a superconducting material like Titanium or Nobium nitride, Nobium or even Aluminium. Preferably, this superconducting material is a type 1 superconductor.

Here, the ESR track is close to the gates 3 (and thus in practice close to the trapped electrons or holes), with, for each gate, a distance typically less than 300 nm or even less than 200 or even 150 nm between the track and the gate considered. When the device comprises several ESR tracks (FIG. 7), the distance in question is the distance between the gate considered and the ESR track that is closest to it. And when the ESR track of the device comprises several portions respectively assigned to the different gate rows, each portion being parallel to the gate rows (FIG. 9), the distance in question is the distance between the gate considered and the portion of the track which is closest to this gate.

This proximity makes it possible to generate, at the trapped electrons, an oscillating magnetic field with a typical amplitude of between 1 and 30 milliteslas for a moderate intensity $I_{ESR}$ of the remaining current of typically between 0.1 and 10 milliamperes. This proximity also makes it possible, for a given amplitude of the field $B_{AC}$ at the gates, to limit amplitude of the oscillating magnetic field that is exerted elsewhere in the device, in particular in the BEOL portion mentioned above.

This proximity between the ESR track and the gates 3 (more precisely: between the ESR track and the potential well(s) located in the channel portion) results especially from the low thickness character (at least locally) of the insulating layer 20. This layer initially forms the box of an SOI type substrate (substrate having served as a basis for the manufacture of the device), or at least part of this box, when the latter has been thinned during the manufacturing method. In any case, the fact that SOI substrates with initially low thickness boxes are commercially available (200 nm or even less) facilitates obtaining such a thin insulating layer.

The ESR track may be located directly against the back side 22 of the insulating layer 20 (which layer 20 may be locally etched or thinned, at the ESR track). The ESR track may also be separated from this back side 22 by an ancillary layer or layers. This ancillary layer is for example a metallisation layer. It may also be, as in the case of device 10b of FIG. 24, an additional, relatively thin, silicon layer 102 (in a sense residual) corresponding to a part of the HR-Si support layer 101 of the SOI substrate which would not have been removed (case of a HR-Si layer which has not been completely thinned, or not completely etched). This additional layer could also be a layer formed by a material (in practice, a dielectric material) other than silicon. Moreover, the aforementioned metallisation layer could be interposed between the ESR track and this additional layer 102. In any case, whether these additional layers are present or not, the distance $d_z$ which, along the z-axis, separates the ESR track(s) from the gate(s) 3 is here less than 200 nm, and even less than 150 nm or even less than 100 nm (or even less than 20 nm, with, for example, a box and a channel portion of 10 nm thickness each). This distance corresponds to the distance, along the z-axis, between the ESR track and the back face of each gate 3 (the face of the gate that is in contact with the channel portion 2).

In the embodiments represented in the figures, the ESR track(s) (is) are also close to the gates 3 from a lateral viewpoint. When the device comprises a single ESR track, this track either passes directly under the gates 3, vertically aligned with each gate (see FIG. 17 for example), or is laterally offset, but with a small lateral gap $d_y$ from the gates. The lateral gap $d_y$ is the distance, in a projection onto a plane parallel to the insulating layer 20, between the ESR track and the edge of the gate 3 considered (see FIG. 3). And when the device comprises several ESR tracks, the lateral gap $d_y$ is the distance which, in a projection onto a plane parallel to the insulating layer 20, separates the edge of the gate 3 considered from the ESR track which is closest.

The lateral gap $d_y$ in question is, for example, less than or equal to the distance $d_z$ mentioned above. It may be less than or equal to 200 nm, or even 150 or 100 nm (or even 60 or even 20 nm).

Figure 3:
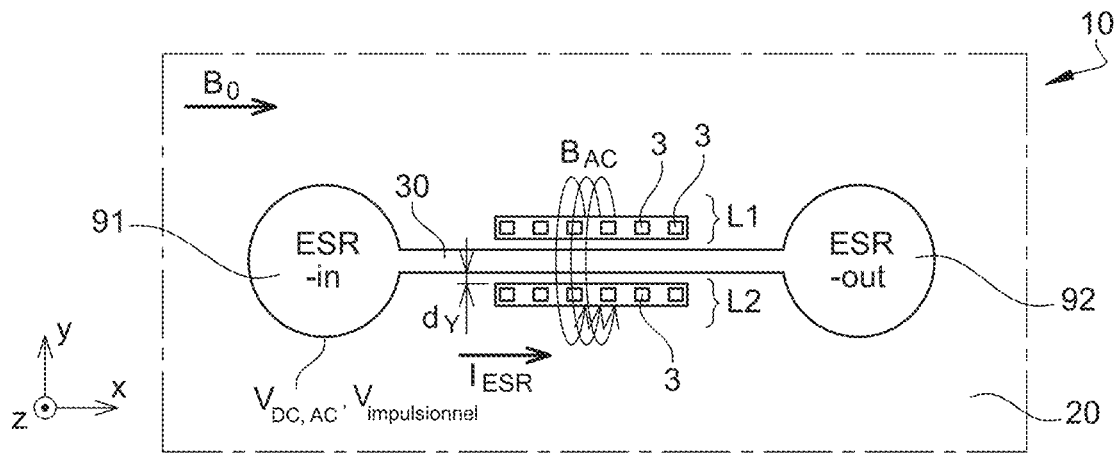
FIG. 3 schematically represents, in a bottom view, one embodiment of a device for storing, controlling and manipulating semiconductor qubits implementing the present technology.

By way of example, for the device 10 corresponding to the embodiment of FIG. 3 (a device which is also represented in FIG. 4), the trapping structure includes 12 gates distributed in two parallel rows L1 and L2 each gathering six gates 3. The ESR track 30 is rectilinear and parallel to the two gate rows L1, L2. In a projection onto the x,y plane (plane parallel to the insulating layer 20), it passes between these two gate rows, at equal distance from these two rows. The lateral gap $d_y$ between the edge of the track 30 and the edge of each gate 3, is for example less than 100 nm and even less than 30 nm, in this example.

As already indicated, the device is made from a silicon-on-insulator (SOI) type substrate. The HR-Si type (thick) substrate support layer, which initially supports the buried oxide layer, may be entirely removed during manufacture and no longer present in the device, once manufactured, as in the case of FIGS. 4 to 6. The buried oxide layer may further be thinned, either over its entire surface or more locally, at the ESR track. Alternatively the support layer of the substrate could be partly kept by etching at the ESR track (to provide access to the back face of the buried oxide layer), but not over the entire substrate surface.

The device 10; 10b; 11; 12; 13; 14; 15; 16; 17; 18; 19 comprises a second set of interconnecting electrical conductors, 27, which electrically connect the ESR track(s) to second pads or contact elements 28, remote from that track. This second set of conductors 27 extends from the back side 24 of the insulating layer 20. But it may optionally extend from the front side 23 (as in FIG. 6), to provide electrical connection at the front face for all of the elements of the device 12.

Here, the trapping structure 1, the first set of interconnection conductors 25 (and more generally the BEOL), as well as the insulating layer 20 are part of a first chip 5 (front chip). A second chip 6; 7; 9 (back chip), possibly supplemented by a third chip 8 (FIG. 6), serves as a support for the second set of conductors 27 (conductors that allow the electrical connection of the ESR track(s) to be offset).

The first chip 5 and the second (and possibly third) chip 6; 7; 9 can be assembled to each other by hybrid bonding (case of the device 11 of FIG. 5, for example) and/or by using metal bumps or microbumps, with or without micro-solder balls.

In the case of the device 10 of FIGS. 3 and 4 (represented in a bottom view in FIG. 3, and a side view in FIG. 4), the second chip 6 is a silicon interposer, through which deep TSV (through silicon via) type vias pass. This interposer may include a RDL (redistribution layer) to redistribute electrical connections from a planar perspective. The electrical connection of the ESR track 30 with the electrical conductors 27 of the second chip 6 is achieved by virtue of two micro-solder balls 29, and by virtue of two contact pads 91, 92 initially present on the first chip 5 and which are connected to a first end and to a second end respectively of the ESR track 30 (FIG. 3), the two microballs 29 coming into contact with these two pads 91, 92 (with a relatively large size, especially with respect to the track 30, to facilitate contact with the second chip 6). The set comprising the track 30 and these two contact pads 91, 92 may, for example, be etched in a same layer of superconducting material previously deposited on the back side of the first chip 5.

In the case of the device 11 of FIG. 5, the second chip 9 comprises a substrate 80 of silicon, preferably made of isotopically pure silicon $^{28}$Si, through which especially two conductive vias for electrically connecting the two ends of the ESR track 30 to the distant contact elements 28 pass.

As for the device 12 of FIG. 6, it comprises three chips, 5, 7 and 8 assembled together. The third, optional, chip 8 serves to redistribute the electrical contacts at the back of the device 12. As already mentioned, in this embodiment, the device 12 comprises a redistribution of the electrical connections of the ESR track 30 to the front face 204 of the device 12. More precisely, the second chip 7 comprises a silicon substrate 80, through which two conductive vias 81 pass from end to end, which are brought into contact with the track 30 through two micro-solder balls 29 in order to be able to inject the current $I_{ESR}$ thereinto, as in the case of the device 10 of FIG. 4. At the back, these two vias 81 are electrically connected to the third chip 8 via, again, microballs 82. The third chip 8 redistributes these electrical connections to the side of the device 12 (laterally) to allow return to the front face. More precisely, the third chip connects the vias 81 mentioned above to return vias 84, which also pass through the substrate 80 of the second chip 7. These vias are connected, on one side to the chip 8, by microballs 82, and on the other side to the first chip 5 by microballs 85 which bring them into contact with vias 86 which finally bring the two electrical connections to the track 30 at the front face 204 of the device 12. The third chip 8 may also integrate or support, active or passive, electronic components such as an electric current source or an impedance transformer. In the event that the third chip 8 includes such an impedance transformation component, it is an electric power PRF that may be injected at the remote contact element 28, the impedance transformer delivering, from this power, the current $I_{ESR}$ (the source of this power PRF being located outside the cryogenic environment, for example). In the case where the third chip 8 integrates a current source, which generates the current $I_{ESR}$, it is a control or supply voltage that can be applied at the remote contact element 28, to cause the $I_{ESR}$ current to flow. As for the voltage control signals of the ESR track, used as a back gate (to control the energy landscape where the electrons or holes are trapped), as already indicated, they can be DC, AC, pulse, modulated, or a superimposition of such signals (for example a DC voltage with superimposed voltage pulses). It will be noted that it is possible to use (share) a same electrical signal for both functionalities set forth above, namely the generation of the oscillating magnetic field (for the ESR resonance), and the control of the electric potential of the ESR track, used as a back gate.

Apart from the presence of the return vias at the front face 86, the first chip 5 is identical in the case of device 12 and in the case of device 10. In particular, the trapping structure 1 is the same, with its two gate rows L1 and L2. And the rectilinear configuration of the ESR track which passes, as it were, between these two rows, is also the same. In the case of the device 11 in FIG. 5, the first chip 5 is identical to that of the device 10 in FIG. 3, except that each gate row 3 comprises three gates instead of six. The rectilinear configuration of the ESR track, which, in a projection onto the x,y plane, passes between these two rows, is also the same as in FIG. 3.

The device 10; 10*b*, 11; 12; 13; 14; 15; 16; 17; 18; 19 may also comprise (regardless of the embodiment):

- a current source, which delivers the alternating current $I_{ESR}$ for supplying the ESR track(s) (this may be a source delivering a controllable electric current or power), and/or
- an electric voltage source, an output terminal of which is connected to the ESR track(s), and which allows the electric potential ($V_{DC}$, $_{AC}$, $V_{impulsionnel}$) of that track(s) to be controlled (DC, low frequency or high frequency AC, or pulse electric potential, or being a combination of such electric potentials), thereby giving an additional degree of freedom to control the energy landscape in which the electrons or holes are trapped.

These sources may be integrated into the microcircuit set forth above (the microcircuit which comprises the trapping structure 1 and the ESR track(s), and which is formed by, for example, the aforementioned chips), or may be implemented as separate electrical circuits or devices electrically connected to the microcircuit which incorporates the trapping structure 1 and the ESR track(s).

Configuration of the ESR Track or Tracks

In general, the device 10; 10*b*; 11; 12; 13; 14; 15; 16; 17; 18; 19 comprises at least one gate row, or one row of islands of gates.

In the following explanations, for simplicity of explanation, it is considered that the device comprises a single gate 3 per qubit, these gates being arranged in rows (or possibly along a same row). However, the characteristics and arrangement set forth below can be applied in the same way in a case where there are several gates for each qubit (for example two gates per qubit). In this case, the different islands (groups) of gates, associated with the different qubits respectively, will be arranged in rows, in the same way as the gates 3 represented in the figures. More generally, the device could comprise several gate islands, each gathering several gates, these islands being arranged in the same way as the individual gates 3 visible in the figures.

It may include a single ESR track, extending, at least on average, parallel to the gate row(s). This track may be rectilinear, parallel to the gate row(s), as in FIG. 3, or it may be non-rectilinear, meandering along an average xo-axis which is parallel to the gate row (see FIGS. 16 and 17 for example); the track then extends, on average, along this axis parallel to the qubit row. The ESR track typically extends along the entire length of the gate row(s).

The device may also include a plurality of ESR tracks, each of these tracks extending, at least on average, parallel to the row, or parallel to the rows of qubits (see tracks 30-34 in FIGS. 7 and 8 for example), such tracks thus extending parallel to each other. In practice, these ESR tracks are then electrically connected in parallel to each other, and the direction of current is then the same in the different tracks 30-34. Each track 30-34 extends, for example, from a first contact pad 91, common to the different tracks, to a second contact pad 92 (FIGS. 7 and 8).

This configuration, with an electrical parallel arrangement, allows individual switching of each track 30-34, so as to selectively apply an oscillating magnetic field to a particular qubit row, in order to modify only orientation of the spins of the row thus selected. The device 13 of FIG. 7 and the device 14 of FIG. 8 each moreover comprise a switch or selector 90, which may be of the active (that is: controlled) or passive (for example with threshold) type, and which is interposed, along the tracks, for example between the first contact pad 91 and the beginning of the zone located vertically aligned with the qubit matrix.

Moreover, in one embodiment, in which all the tracks 30-34 would be traversed simultaneously by the current $I_{ESR}$, or in the absence of the switch or selector 90, in this configuration an oscillating magnetic field BAC is obtained which has a fairly slow decrease as a function of the distance (because the direction of the current is the same in all the tracks, contrary to the case of FIG. 9 for example). This configuration is therefore well adapted to the case of a relatively thick insulating layer 20 (200 nm for example), because the distance between ESR tracks and qubits is then quite large.

Figure 10:
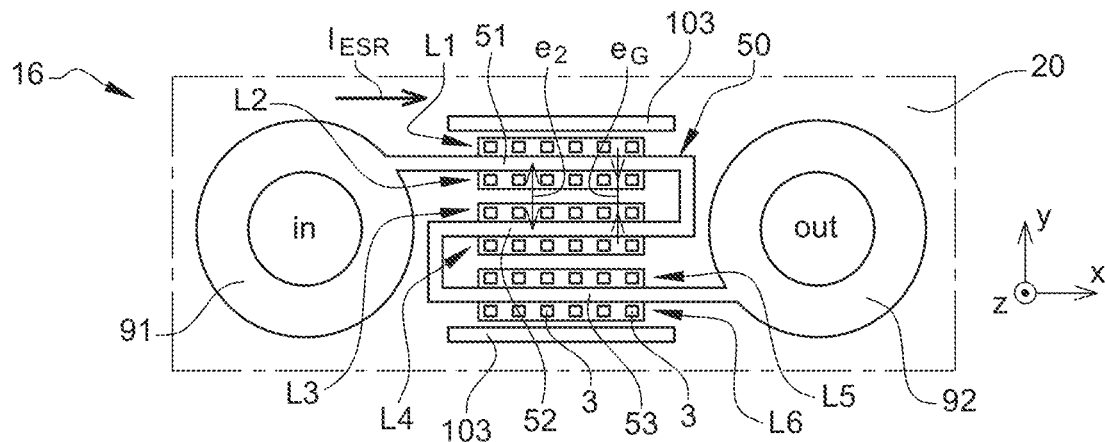
FIG. 10 schematically represents a seventh embodiment of such a device, in a bottom view.

In other exemplary embodiments, such as those of FIGS. 9 and 10, the device 15; 16 includes the same ESR track 40; 50, but with several successive portions 41-45; 51-53, each portion extending, at least on average, parallel to the row, or parallel to the rows of qubits (see portions 41-43 of track 40 in FIG. 9, for example), along the entire length of the row (or rows) of qubits. These different portions, parallel to each other, are electrically connected in series one after the other, the track 40; 50 thus meandering from one side of the qubit matrix to the other, and so on. The direction of the electric current is thus reversed from one portion of the track to the next. For example, in the portion 41 of the track 40, it flows in the +x direction while in the next portion 42, it flows in the −x direction.

This configuration makes it possible, in some cases such as that of FIG. 9 for example, to obtain an oscillating magnetic field exclusively or almost exclusively directed along the z-axis.

Figure 23:
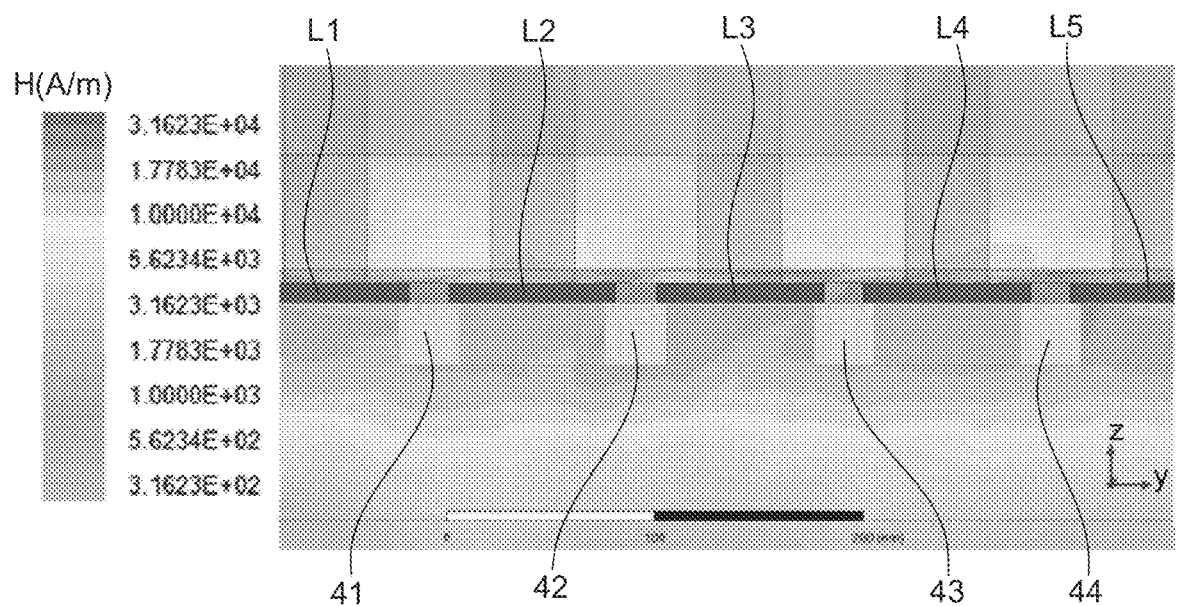
FIG. 23 schematically represents, in an axial cross-section view, results of numerical simulation of the magnetic excitation generated by ESR tracks, at different points of another device for storing, controlling and manipulating semiconductor qubits.

Moreover, in this configuration, as the direction of the current reverses from one portion of the track to the other, an oscillating magnetic field is obtained, whose amplitude decreases very rapidly with distance as one moves away from the track (see FIG. 23 for example). This configuration is therefore well adapted to the case of a very thin insulating layer 20 (for example with a thickness of less than 60 or even 30 nm), and it will then allow the amplitude of the oscillating magnetic field to be strongly limited elsewhere than on the trapping structure 1.

The configuration of the ESR track, or tracks, for the embodiments represented in FIGS. 7 to 11 respectively, is now set forth in more detail, figure by figure. For these five embodiments, the trapping structure includes a qubit matrix M that includes six rows of qubits, that is, six gate rows 3, denoted L1, L2, L3, L4, L5, and L6, with each row including six qubits. As already indicated, these figures are set forth for illustrative purposes, and the device according to the invention may of course include a number of gate rows other than six.

The device 13 of FIG. 7 comprises five ESR tracks 30, 31, 32, 33, 34 (and more generally, in such a configuration, the number of qubit rows is n while the number of ESR tracks is n−1). In a projection onto a plane parallel to the insulating layer 20, each ESR track extends between two neighbouring qubit rows, being interposed between these two rows, and, in this case, at equal distance from the two qubit rows (in the middle of these two rows). Track 30 thus extends between rows L1 and L2, track 31 extends between rows L2 and L3, track 32 extends between rows L3 and L4, and so on. Tracks 30-34 are evenly spaced from each other, laterally, with a pitch e1 (pitch along y-axis) equal to the pitch $e_G$ between qubit rows. The ESR tracks have a width (extension in the y-direction) less than the pitch $e_G$ in question, for example less than or equal to half the pitch $e_G$.

In this configuration, at the qubits, the oscillating magnetic field $B_{AC}$ generated by the ESR tracks, when they are all traversed by the same alternating electric current, is a field whose component along the x-axis is zero, and whose component along the z-axis is very weak (in comparison with the component along the y-axis), or even zero.

The device 13 also comprises, for example on either side of the set of tracks 30-34, optional "dummies" 103, that is track portions formed of the same material as the ESR tracks (typically a metal material). These "dummies", or "false tracks", make it possible, during a step of planarising and/or polishing the back of the insulating layer 20, to avoid irregular or excessive erosion of the surface to be polished. They also promote adhesion between the front and back chips of the device, when they are assembled by "hybrid bonding" (in this case, the back chip will also comprise "dummies", located in correspondence with those, 103, of the front chip). Herein, the dummies 103 are strip-shaped, comparable to the ESR tracks 30-34, and are parallel to these tracks.

The device 14 of FIG. 8 is identical in every respect to the device 13 of FIG. 7, except that it comprises only three of the five ESR tracks 30-34 mentioned above, namely tracks 30, 32 and 34. More generally, for this type of embodiment, the number of qubit rows is n, with n being even, and the number of ESR tracks is n/2. The tracks 30, 32, 34 are evenly spaced from each other, from a lateral point of view, with a pitch e2 (pitch along the y-axis) equal to twice the pitch $e_G$ between qubit rows. In contrast to the embodiment in FIG. 7, the oscillating magnetic field on a qubit row is mainly generated by a single ESR track, here (the one closest to the qubit row in question), instead of two. And each ESR track is somehow in charge of generating the oscillating magnetic field for two qubit rows, in this case for the two qubit rows located on either side of the ESR row (for example rows L1 and L2, in the case of track 30).

This embodiment with the set of ESR tracks having a pitch e2 that is somewhat relaxed with respect to the pitch $e_G$ of the qubit rows is easier to manufacture than that of FIG. 7.

In this configuration, at the qubits, the oscillating magnetic field $B_{AC}$ generated by the ESR tracks, when they are all traversed by the same alternating electric current, is a field whose component along the x-axis is zero. On the other hand, unlike the device 13 of FIG. 7, the component along the z-axis is not zero.

The device 15 of FIG. 9 comprises a single ESR track 40 which includes five successive portions 41, 42, 43, 44, 45, each parallel to the qubit rows L1-L6. As explained above, these portions connect one after the other to meander from one side of the qubit matrix to the other. In such a configuration, the number of qubit rows is more generally equal to n (with n even) while the number of main portions of the ESR track, parallel to the qubit rows, is equal to n−1. The track 40 extends from the first contact pad 91, on the left of the qubit matrix, to the second contact pad 92, on the right of this matrix, making several round trips from left to right.

In a projection onto a plane parallel to the insulating layer 20, each portion 41-45 of the track 40 extends between two neighbouring qubit rows, being interposed between these two rows, and, in this case, at equal distance from these two qubit rows (in the middle of these two rows). The track 41 for example extends between the rows L1 and L2, the portion 42 extends between the rows L2 and L3 and so on. The portions 41-45 are evenly spaced from each other, from a lateral point of view, with a pitch e1 (pitch along the y-axis) equal to the pitch $e_G$ between qubit rows. These ESR track portions each have a width (extension in the y-direction) less than the pitch $e_G$ in question, for example less than or equal to half the pitch $e_G$.

In this configuration, at the qubits, the oscillating magnetic field $B_{AC}$ generated by the ESR track 40 has zero components along the x-axis and along the y-axis: this field is directed along the z-axis. Moreover, for each qubit row, the $B_{AC}$ field generated at the qubits of the row is mainly generated by the two track portions located on either side of this line. For example, for row L3, it is mainly portions 42 and 43 that contribute to the magnetic field $B_{AC}$ exerted on the qubits of that row. And in this configuration, where the direction of the current reverses from one portion to the other, the two contributions, due respectively to these two row portions, constructively add up, at the qubits (in other words, these two track portions generate respectively two magnetic fields having, along the z-axis, components with the same sign).

This configuration makes it possible to generate a magnetic field with high efficiency, that is with a high $B_{AC}/I_{ESF}$ ratio.

Finally, as can be seen in FIG. 9, the device 15 also includes the optional "dummies" 103 mentioned above.

The device 16 of FIG. 10 is similar to that of FIG. 9 but with, between two successive portions of the ESR track 50, a pitch e2 equal to twice the pitch $e_G$ between qubit rows (pitch along the y-direction). The track 50 thus comprises three main portions 51, 52, 53, each parallel to the qubit rows L1-L6, and which together form a kind of serpentine that runs between these rows. More generally, for this type of embodiment, the number of qubit rows is equal to n, with n being even, and the number of main portions of the track, parallel to the qubit rows, is equal to n/2.

In contrast to the embodiment in FIG. 9, the oscillating magnetic field on a qubit row is mainly generated by a single portion, 51, 52 or 53 of the ESR track (the portion that is closest to the qubit row in question), here, instead of two portions. And each portion is somehow in charge of generating the oscillating magnetic field for two qubit rows (for the two qubit rows located on either side of the portion in question).

This embodiment with, for all the ESR tracks, a pitch e2 that is somewhat relaxed with respect to that $e_G$ of the qubit rows, is easier to manufacture than that of FIG. 9. On the other hand, it does not achieve the constructive sum effect mentioned above, and the $B_{AC}/I_{ESR}$ ratio is lower than for the configuration of FIG. 9. In terms of orientation, the oscillating magnetic field $B_{AC}$ generated by the track 50 at the qubits has a zero component along x-axis while its components along z-axis and y-axis are generally non-zero.

Figure 11:
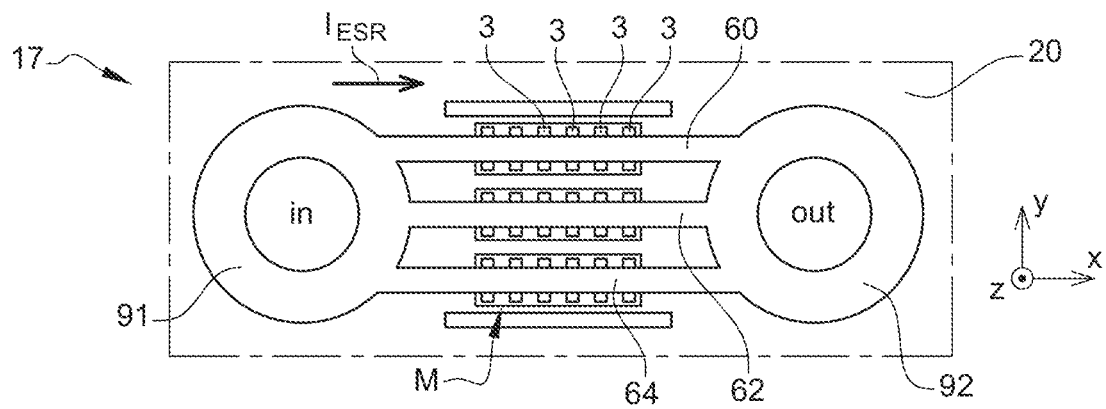
FIG. 11 schematically represents an eighth embodiment of such a device, in a bottom view.

The device 17 of FIG. 11 is identical to the device 14 of FIG. 8, except that the three ESR tracks 60, 62, 64 are wider than the tracks 30, 32, 34 of device 14. For example, tracks 60, 62 and 64 have a width equal to the pitch $e_G$ between two qubit rows, or even greater than $e_G$. This configuration is more convenient to implement than narrow tracks such as those of FIG. 8, and is more favourable in terms of controlling the static or pulse electric potential at the back of the traps. However, this configuration with wide tracks may influence properties of the generated magnetic field (in terms of direction, and possible influence of edge effects), and is less favourable in selectively addressing individual qubit rows. This structure may have an inhomogeneous magnetic field at the border of the structure along the y-axis, with an uncancelled Z component of the magnetic field and an increased Y component. In order to homogenise the magnetic field generated (to have a comparable magnetic field value for the different qubits of the structure), it may be necessary to remove the outermost channel portions along the Y axis or to add ESR tracks outside the structure (in place of the "dummies" for example), or to adapt the width of the tracks along the Y axis, in particular for the tracks located near the edges of the structure (tracks 60 and 64). Indeed, widening the tracks 60 and 64 further makes it possible to substantially improve homogeneity of the magnetic field at the various qubits of the matrix M as confirmed by numerical simulation. When a greater width is used for the ESR tracks located at the border of the structure, care should preferably be taken to maintain symmetry for all the tracks with respect to the median axis of the structure (track 60 as wide as track 64, for example).

It will be noted that one alternative with wide tracks, or with portions of wide tracks (typically wider than $e_G/2$, or even wider than $e_G$ in the case of devices 14 and 16) can be implemented not only for the device of FIG. 8, but also for those of FIGS. 7, 9 and 10.

In the embodiments represented in FIGS. 7 and 9, ESR tracks 30-34, or portions 41-45 of ESR track 40, are laterally offset from the qubit rows L1-L6 (in a projection onto the xy plane, they are offset from the qubit rows). As an alternative, even if it means modifying the number of tracks or track portions, it could be envisaged that they are located vertically aligned (i.e. in line) with the qubit rows, that is that they are superimposed on the qubit rows (for example centred on these lines), in a projection onto the xy plane. As an example, for the device 13 (FIG. 7), this could be achieved by shifting the set of tracks 30-34 by a distance $e_G/2$ in the y-direction, and adding a sixth ESR track extending, at the back face, vertically aligned with the qubit row L6, along this line.

Arranging the ESR tracks, or portions of the ESR row, in this manner vertically aligned with the qubit rows is favourable in terms of controlling the electric potential $V_{DC,AC}$, $V_{impulsionnel}$ applied to the back side of the traps. However, this changes the properties of the magnetic field generated and, for example, the constructive sum effect of the configuration represented in FIG. 9 is no longer achieved.

Figure 12:
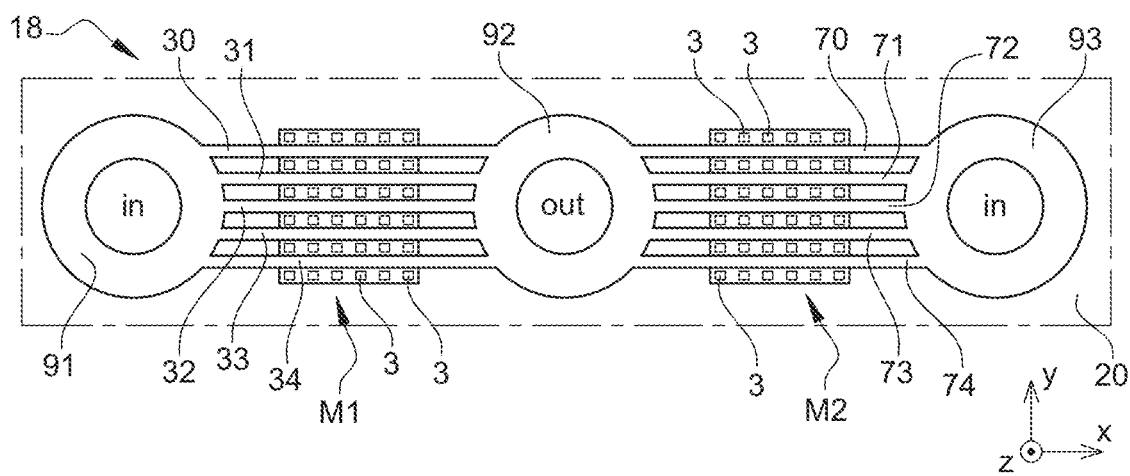
FIG. 12 schematically represents, in a bottom view, a device for storing, controlling and manipulating semiconductor qubits comprising two devices such as that of FIG. 7, networked one after the other.
Figure 13:
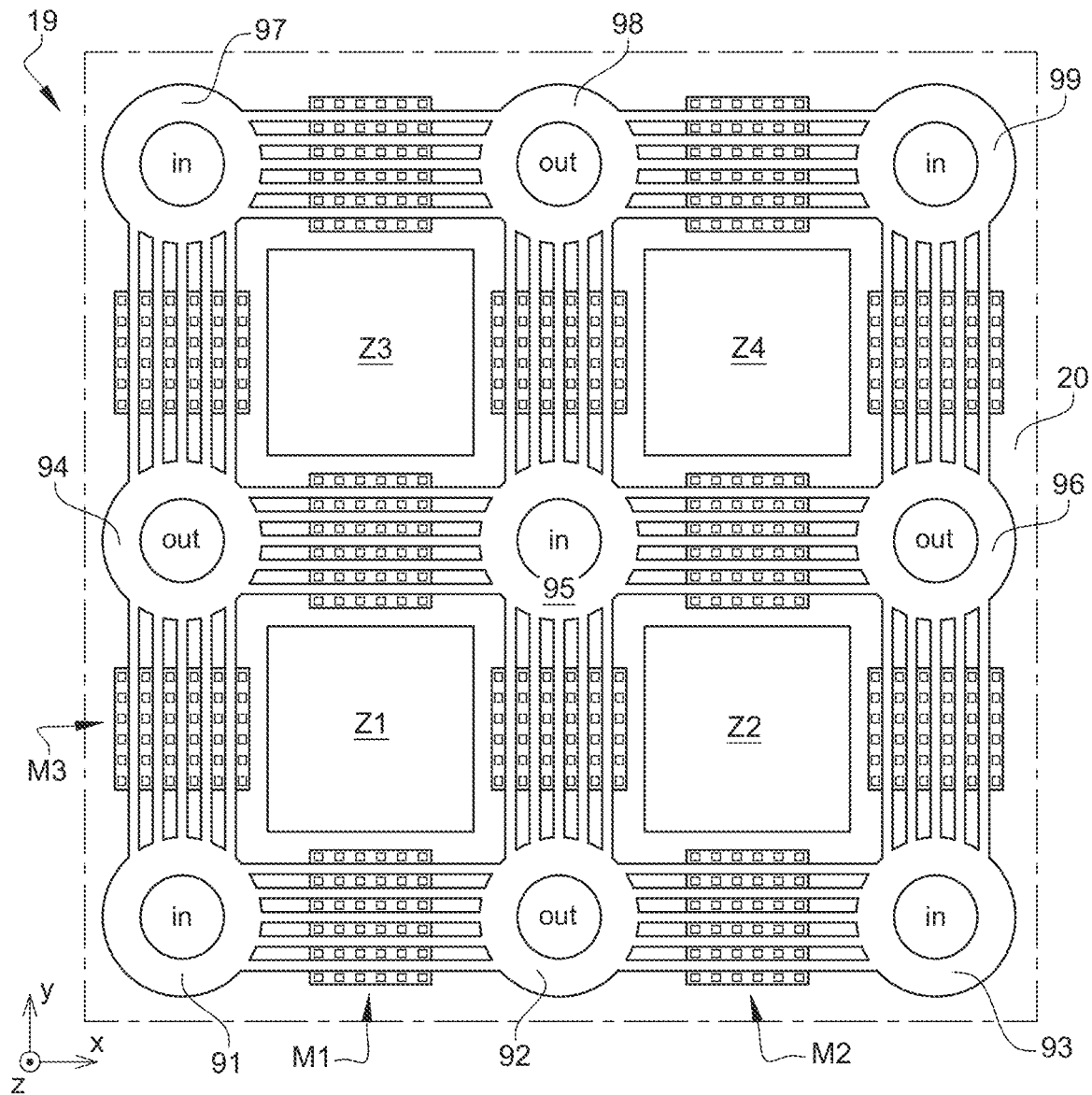
FIG. 13 schematically represents, in a bottom view, a device for storing, controlling and manipulating semiconductor qubits comprising a plurality of devices such as that of FIG. 7, networked together.
Figure 14:
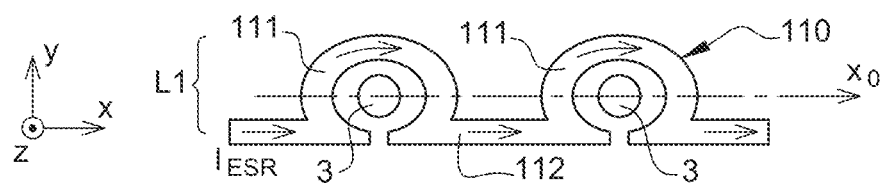
FIG. 14 schematically represents one alternative contemplatable for the geometry of an ESR electrical track that may equip any of the devices of FIGS. 3 to 13.

FIG. 12 shows a device 18 comprising two matrices M1 and M2 of 6×6 qubits, each identical to the qubit matrix M of device 13 (FIG. 7). The device 18 corresponds in a way to a duplicated, extended version of the device 13 of FIG. 7.

The two qubit matrices M1 and M2 each comprise six qubit rows (with 6 qubits per row), parallel to the x-axis.

The first matrix M1 is located between the first contact pad 91 and the second contact pad 92, while the second matrix is located between the second contact pad 92 and a third contact pad 93. The two matrices M1 and M2 are aligned with each other (they are arranged along the same line, parallel to the x-axis). A first set of ESR tracks, comprising five ESR tracks 30-34, identical to those of the device 13 in FIG. 7, extends from the first pad 91 to the second pad, and allows the qubits of the first matrix M1 to be driven by ESR-type resonance. Similarly, a second set of ESR tracks, comprising five ESR rows 70-74, extends from the second pad 92 to the third pad 93. This second set of ESR rows, identical to the first set, allows the qubits of the second matrix M2 to be driven by ESR type resonance.

The first and third pads 91 and 93 are current input pads while the second pad 92, common to both sets of ESR rows 30-34 and 90-94, is a current output pad (it is for example connected to an electrical ground of the device).

As an alternative, the two sets of ESR tracks, which drive the two matrices M1 and M2 respectively, could be of the same type as for the device 14 of FIG. 8, with one ESR track for two qubit rows (instead of having one ESR track for each qubit row).

Also, as an alternative, a configuration of the same type as for devices 15 and 16 could be used with, for each matrix M1, M2, a single ESR track forming meanders that run from one side of the matrix to the other, in parallel to the qubit rows.

On the other hand, instead of having one contact pad common to both sets of ESR tracks (the second pad 92), the two sets of ESR tracks, associated with both matrices M1 and M2 respectively, could each be provided with two contact pads of their own (the device then comprising four contact pads).

The example of FIG. 12 shows that the structure set forth above, with reference to FIGS. 7 to 11 (structure with a qubit matrix and a serpentine ESR row, or several ESR rows connected in parallel), properly lends itself to the networking of several qubit matrices, integrated in the same device. These matrices may themselves be arranged to form a matrix of matrices (a "meta-matrix"), as in the device 19 of FIG. 13.

The device 19 comprises 12 qubit matrices, each including six rows of six qubits (that is 432 qubits). It also includes nine contact pads 91-99, arranged in three rows of three pads. Each qubit matrix is located between two of the pads 91-99. A set of five parallel ESR tracks is provided for each matrix, these tracks extending from one of the contact pads to the one on the other side of the matrix considered.

The pads 91, 93, 97 and 99, located at the four vertices of this "meta-matrix", are current input pads, as is the one, 95, located at the centre of the meta-matrix (at the centre of the matrix). The other pads, 92, 94, 96 and 98 (located in the middle of the four sides of this meta-matrix) are current output pads. Each contact pad has a lateral extension close to, or even identical to, that of each qubit matrix.

Each qubit matrix may be equipped with a switch or selector, such as that, 90, of device 13 (FIG. 7).

This arrangement of qubit matrices allows for convenient integration of such a network of qubit matrices in the same device. Indeed, this arrangement leaves a substantial space for each contact pad (thereby making pads large enough to make good contact with another chip). Furthermore, between each group of four qubit matrices, a zone Z1, Z2, Z3, Z4 is left free, which can be used to create other elements on the back face, or as a DC signal input zone for controlling the qubits, or for a return to the front face of electrical contacts. Furthermore, each matrix can be individually addressed, in terms of flow of the current $I_{ESR}$ (and indeed, each qubit row, when the device is equipped with the switches/selectors mentioned above). Finally, the device can be freely scaled down, depending on the size of the desired network of matrices (a network of 4 matrices, as well as eight times five matrices, or k times l matrices can be made on this same model). In the device 13; 14; 15; 16; 17; 18; 19, it may be necessary to homogenise the magnetic field generated at the qubits, in particular at the border of the structure along the y-axis. For this, it is possible to adjust width of the ESR tracks, or event to add outer tracks to compensate for edge effects. Other solutions to homogenise the generated magnetic field are to remove the outermost channel portions along the Y axis.

In the embodiments represented in FIGS. 3 and 7 to 13, the ESR tracks are rectilinear, or comprised of rectilinear portions parallel to the qubit rows.

However, as mentioned above, these ESR tracks, or the track portions assigned to a given qubit row, may also be non-rectilinear, and meander on either side of a mean xo-axis parallel to the qubit row considered, as represented in FIGS. 14 to 21. In these figures, different alternatives are represented, in a bottom view, contemplatable for the geometry of such an ESR track, or for the geometry of an ESR track portion assigned to a of qubit row L1.

In each of these examples, the track, 110; 120; 130; 140; 150; 160; 170; 180, forms, in a plane parallel to the insulating layer ((x,y) plane), at each gate 3 (or, at each island of gates), in a projection onto the (x,y) plane, a loop portion 111; 121; 131; 141; 151; 161; 171; 181. This non-rectilinear loop portion partly surrounds a (small) surface element, over a portion of the periphery of this surface (over a portion of its periphery). For each of these examples, the track 110; 120; 130; 140; 150; 160; 170; 180 thus extends in a plane parallel to the insulating layer.

In particular, in a projection onto the plane parallel to the insulating layer, each of these loop portions 111; 121; 131; 151; 161; 171 may partly surround one of the gates of the row, which is then located at the centre of the loop, or not far from this centre, as in the case of FIGS. 14 to 16 and 18 to 20. It will be noted that it is indeed in a projection onto the (x,y) plane that this portion of the loop surrounds (partly) the gate in question. Indeed, as already indicated, the track (and therefore also this loop portion) extends in a plane parallel to the insulating layer, and on a side of the insulating layer opposite to the trapping structure. It is therefore the geometric projection of the track (and not the track itself), which partly surrounds the gate considered. Stated differently, the gate, which is vertically offset from the plane of the track, is located vertically aligned with the centre of the loop portion, or not far from the vertical alignment of the centre of the loop portion.

Various shapes (set forth in detail below) are contemplatable for the loop portions in question. These loop portions may, for example, correspond to a portion of a circular loop (FIGS. 14 and 18), a rectangular loop (FIGS. 16, 17, 19) or a triangular loop.

The fact that the track forms such loop portions in the vicinity of each gate makes it possible to generate a stronger BAC magnetic field at the qubit considered, for a given current $I_{ESR}$. In comparison with a rectilinear track, this geometry in effect increases the length of track that passes in the vicinity of the gate (and furthermore, for this geometry, the elementary contributions, due to each small part of the loop portion, add vectorially to each other in a constructive manner). Furthermore, this allows the orientation of the generated magnetic field to be controlled, for example with a z-orientation (case of devices 110 and 150). When the static magnetic field B0 is parallel to the plane of the layers (xy plane, here), and when a networking into matrices such as in FIG. 13 (device 19) is performed, it is particularly useful that the oscillating magnetic field generated by each track is directed along the z-axis. Indeed, as some ESR tracks will then be parallel to the x-axis while others will be parallel to the y-axis, in order to obtain an oscillating magnetic field that is orthogonal to the static field $B_0$ (for each ESR track), which orthogonality is necessary for ESR resonance, it is desirable that the oscillating magnetic field created is directed along the z-axis, for each track.

It will be noted that, instead of being centred on the gates, the loop portions 141; 181 may be laterally offset, so that the track 140; 180 overlaps with (passes underneath, in line with) the gate considered. As mentioned above, such an arrangement is favourable from the point of view of controlling the DC electric potential at the back face of the traps. And in terms of the magnetic field generated, it remains interesting because it minimises distance between the row and the qubit considered.

For the tracks 110; 120; 130; 140 and 150 of FIGS. 12 to 18, the loop portions, 111; 121; 131; 141 and 151 respectively, are regularly repeated along the track with a pitch $e_{1,X}$ (pitch along the x-axis) which is equal to the pitch $e_{G,X}$ between gates 3 (pitch along the x-axis). Furthermore, two successive loop portions 111; 121; 131; 141; 151 are connected to each other by a track portion 112; 122; 132; 142; 152 which, here, is rectilinear, parallel to the gate row. Thus, for example, the two trapezoidal loop portions 121 visible in FIG. 15 are connected to each other through the rectilinear portion 122. These rectilinear portions allow, at least in the case of FIGS. 14 to 17, to install a switch between two qubits (even if it means shifting the rectilinear portion 112; 122; 132; 142 in the y-direction farther than represented in the figures). Such a switch makes it possible, for example, to apply different electric potentials, on the back face of the qubits, upstream or downstream of the switch.

The shape of the loop portions is now set out for tracks 110; 120; 130; 140 and 150. For track 110 (FIG. 14), the loop portions 111 are each in the shape of a portion of a circle or ellipse (they form an overshot arc). For track 120 (FIG. 15), the loop portions 121 are each formed by three sides of a trapezium (that is the base and the two tilted sides). For track 130, and for track 140 (FIGS. 16 and 17), the loop portions 131 are each formed by three sides of a square or rectangle (thus it is a portion of a rectangular loop). The track 130, or 140, thus forms a serrated line. For track 150 (FIG. 18), the loop portions 151 each form an arc of circle.

In this case, the track 150 comprises at least two portions, 153 and 154, connected one after the other (as in FIG. 10), each parallel, on average, to the gate row 3. The current direction is thus reversed from portion 153 to portion 154. As each of these portions has arc-of-circle-shaped loop portions at the gates, the result is an almost complete circular loop around each gate (that is almost a complete circle—see FIG. 18), and a magnetic field close to that which would be obtained with a circular loop traversed by the current $I_{ESR}$.

Figure 19:
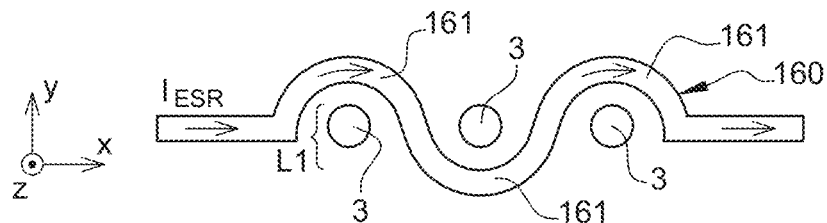
FIG. 19 schematically represents yet another alternative of such an ESR track.
Figure 21:
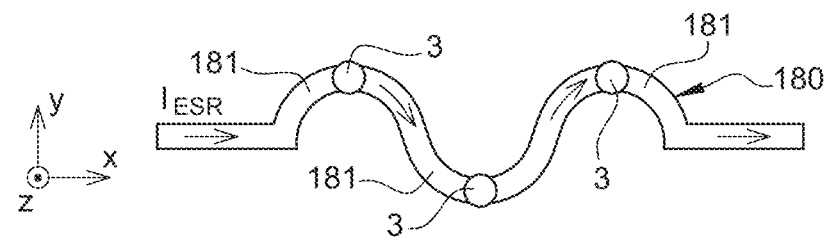
FIG. 21 schematically represents yet another alternative of such an ESR track.

For tracks 160; 170 and 180 of FIGS. 19 to 21, the loop portions, 161; 171 and 181 respectively, are regularly repeated along the track with a pitch $e_{2,X}$ which is equal to twice the pitch $e_{G,X}$ between gates (pitch along the x-axis).

In the case of FIG. 19, for example, the track 160 has a wavy shape, with a circular half-loop 161 (semi-circle) open on one side, then immediately afterwards a circular half-loop 161 open on the other side, and so on. In the centre of each circular half-loop 161 is situated a gate (in a projection onto the x,y plane), both for the half-loops open on the +y side and for those open on the −y side.

The track 160 thus meanders from one side to the other of the gates, along the row L1 (whereas in the case of FIGS. 14 to 17, the track meanders, but always remaining on the same side of the gates, for example on the +y side). The same applies to track 170 in FIG. 20, and to track 180 in FIG. 21. In the case of FIG. 21, the track 180 is identical to the track 160 of FIG. 19, but the gates are laterally offset from each other (they are distributed along a kind of broken line, in triangles), so as to be located in line with the track 180, vertically aligned with it. And in the case of FIG. 20, the track 170 has a serrated shape, each loop portion 171 having the shape of a rectangular half-spiral, successively open on the +y side, then on the −y side and so on.

The track (or track portion) geometries set forth above, with reference to FIGS. 14 to 17 and 19 to 21, can be especially employed in the case of the devices 13, 15, 18 or 19 set forth above (for which the lateral gap e2 between tracks or track portions is equal to the lateral space between gate rows), instead of rectilinear tracks or track portions. It may then be necessary to arrange the ESR tracks two by two opposite to each other to ensure a constructive magnetic field. For devices 14, 16 or 17, FIGS. 17 and 21 can be adapted if the gate rows are offset by x by half a gate gap. For FIG. 18, in contrast to the previous cases, two ESR row portions are used per gate row. In all cases, due to the increased length of the ESR rows, it is preferable to use a superconducting material in order to avoid too high a line resistance. Also in order to reduce the overall length, a gate island configuration is preferable, in particular for the cases of FIGS. 14 and 18.

Furthermore, these track geometries can also be used in devices comprising gate islands, each gathering a few gates, for example two or four gates, these islands being arranged in line one after the other. In this case, the geometry of the track will be the same as set forth above, except that each portion of the loop will partly surround an island of gates, instead of surrounding a single gate. In such an arrangement, each island of gates can serve to store, control and manipulate a single qubit, or several qubits.

Figure 22:
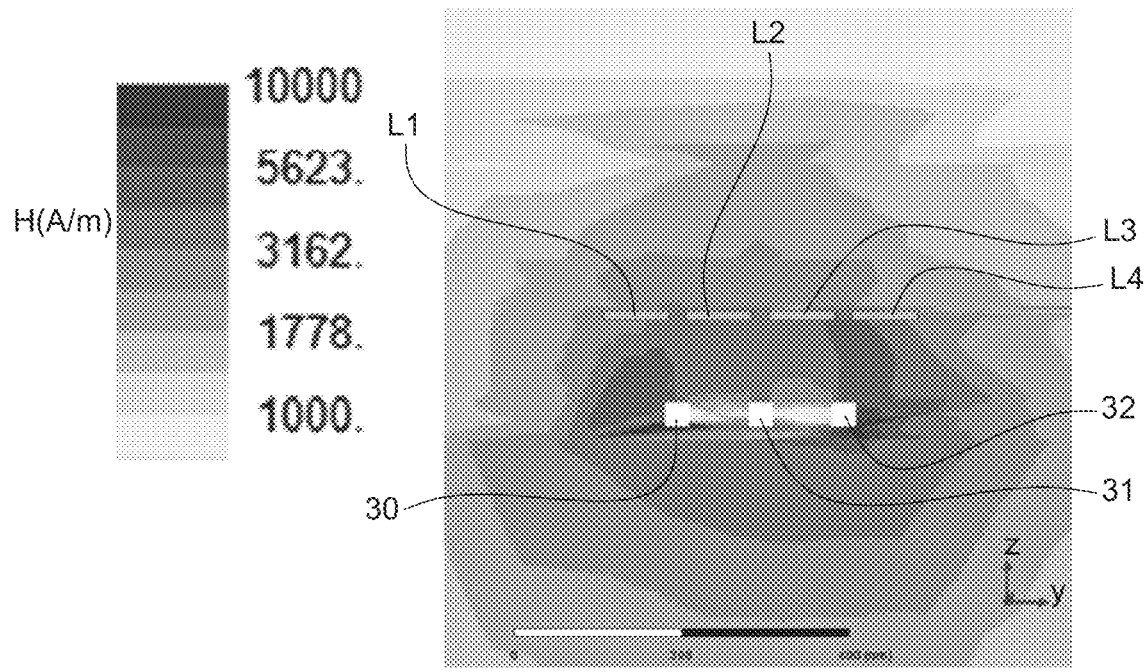
FIG. 22 schematically represents, in an axial cross-section view, results of numerical simulation of the magnetic excitation generated by ESR tracks, at different points of a device for storing, controlling and manipulating semiconductor qubits.

FIGS. 22 and 23 show numerical simulation results for two exemplary embodiments as set forth above. These figures show the device in an axial cross-section view, in a plane parallel to the y,z plane (the x-axis is in turn perpendicular to the plane of the figure). The amplitude of the magnetic excitation $H_{AC}$ (amplitude of the variations of the norm of $H_{AC}$ over time), generated by the electric current $I_{ESR}$ flowing through the track(s), is represented in grey scale. A scale setting out the corresponding values of $H_{AC}$, expressed in amperes per metre, is also represented.

In the case of FIG. 22, the device comprises four qubit rows L1 to L4, and three ESR tracks 30, 31 and 32 through which an electric current flows in the same direction in these three tracks. The pitch $e_G$ between qubit rows is 100 nm. It is equal to the pitch $e_{1,Y}$ between ESR tracks. The ESR tracks have a width and thickness of 30 nm. The distance dz between the tracks and the back faces of the gates ("vertical" spacing between tracks is qubits) is about 100 nm. The total electric current (sum for the three tracks 30, 31, 32) has a peak-to-peak amplitude of about 4 mA.

In the case of FIG. 23, the device comprises five qubit rows L1 to L5, and one track with four portions 41, 42, 43, 44 through which an electric current flows, the direction of which changes from one portion to the next (see device of FIG. 9). The pitch $e_G$ between qubit rows is 100 nm. It is equal to the pitch $e_{1,Y}$ between successive portions of the ESR track. The portions of the ESR track have a width and thickness of 30 nm. For this simulation, which serves mainly as an illustration, the distance $d_z$ is zero. The electric current flowing in the track has a peak-to-peak amplitude of less than 4 mA.

The comparison of FIGS. 22 and 23 does illustrate that the configuration with a serpentine track (FIG. 23) and an electric current flowing in the opposite direction from one portion to the other generates a magnetic field which, along the z-direction, is located very close to the track (between the rectilinear portions 41-44 in question), and which decreases rapidly when moving away from the track. On the contrary, the magnetic field created by the track system of FIG. 22 has a slower decrease when moving away from the set of tracks along the z-axis.

Different alternatives can be made to the embodiments that have been described above, in addition to those already mentioned.

For example, the trapping structure could be implemented differently, for example with a larger number of gates for each qubit (that is for each trap; for example, two or more gates could be provided for each trap, to have more degrees of freedom to control characteristics of the potential wells created).

Furthermore, instead of being made of silicon, and from an SOI type substrate, the device could be made from a GeOI type substrate, of germanium on insulator.

It will also be noted that the different alternatives and embodiments set forth above may be combined together according to any technically contemplable combinations.

The invention claimed is:
1. An electronic device for storing, controlling and manipulating electron or hole spin based semiconductor qubits, the device comprising:
  an electrically insulating layer with, on a front side, a front face, and on a back side, a back face,
  on the front face of the insulating layer, a trapping structure for electrons or holes which includes:
    a channel portion, at least partly formed by a layer portion of semiconductor material extending in a plane parallel to said electrically insulating layer, and
    a plurality of gates distinct from one another, distributed in one or more levels on the channel portion, on a side of the channel portion opposite to said electrically insulating layer, the plurality of gates of the trapping structure being distributed along rows parallel to one another and
  on the back side of the electrically insulating layer, an electric track which extends in a plane parallel to the electrically insulating layer, for generating an oscillating magnetic field exerted on said at least one electron or hole trapped in the trapping structure, the electric track including a plurality of portions, each parallel to said rows, and which are electrically connected in series one after the other to form meanders.

2. The device according to claim 1, wherein the electrically insulating layer has a thickness of between 5 nm and 200 nm.

3. The device according to claim 2, wherein the thickness is between 10 nm and 150 nm.

4. The device according to claim 1, wherein said electric track and said plurality of gates are separated by a distance less than or equal to 200 nm, along a direction perpendicular to the electrically insulating layer.

5. The device according to claim 1, wherein said electric track is separated from said back face by an intermediate layer.

6. The device according to claim 1, wherein the electrically insulating layer is a semiconductor oxide layer making up at least part of the buried oxide layer of a semiconductor-on-insulator type substrate.

7. The device according to claim 6, wherein the semiconductor-on-insulator type substrate is a Silicon-on-insulator (SOI) substrate or Germanium-on-insulator (GeOI) substrate.

8. The device according to claim 1, further comprising:
a first set of electrical interconnection conductors, which electrically connect the plurality of gates to first pads or contact elements remote from the trapping structure, said first set of conductors extending from the front side of the electrically insulating layer, and
a second set of electrical interconnection conductors, which electrically connect said electric track to second pads or contact elements remote from said electric track, said second set of conductors extending on the back side of the electrically insulating layer,
the device not comprising an electrical connector which is electrically connected to the plurality of gates and which is located on the back side of the electrically insulating layer, or, not comprising an electrical connector which is electrically connected to said electric track and which is located on the front side of the electrically insulating layer.

9. The device according to claim 1, wherein, in a projection onto a plane parallel to the electrically insulating layer, the electric track is at least partly superimposed with each of the plurality of gates.

10. The device according to claim 1, wherein said track portions are periodically laterally spaced from each other with a spacing which is the same as the spacing which laterally separates two adjacent gate rows.

11. The device according to claim 1, wherein said track portions are periodically laterally spaced from each other with a spacing which is twice a spacing which laterally separates two adjacent gate rows.

12. The device according to claim 1, wherein said electric track forms several loop portions, each loop portion being located at one of said plurality of gates, or at a gate island gathering some of said plurality of gates, in a projection onto a plane parallel to the electrically insulating layer.

13. A method for driving an electronic device according to claim 1, comprising injecting an alternating electric current into said electric track to generate said oscillating magnetic field, and wherein the electric track is further employed as a back gate, an electric potential being applied to said electric track to control an electric potential landscape within the channel portion where said at least one electron or hole is trapped, said electric potential being a static, or low frequency, or radio frequency, or pulse electric potential, or being a combination of such electric potentials.

14. A method for manufacturing an electronic device for storing, controlling and manipulating electron or hole spin-based semiconductor qubits, the device comprising an electrically insulating layer with, on a front side, a front face, and on a back side, a back face, the method comprising:
on the front face of the electrically insulating layer, making a trapping structure for electrons or holes which includes:
a channel portion, at least partly formed by a layer portion of semiconductor material extending in a plane parallel to said electrically insulating layer, and
a plurality of gates distinct from one another, distributed in one or more levels on the channel portion, on a side of the channel portion opposite to said electrically insulating layer, the plurality of gates of the trapping structure being distributed along rows parallel to one another, and
on a back side of the electrically insulating layer, making an electric track which extends in a plane parallel to the electrically insulating layer, for generating an oscillating magnetic field acting on said at least one electron or hole trapped in the trapping structure, the electric track including a plurality of portions, each parallel to said rows, and which are electrically connected in series one after the other to form meanders.

\* \* \* \* \*